United States Patent
Shin et al.

(10) Patent No.: US 12,216,403 B2
(45) Date of Patent: Feb. 4, 2025

(54) POSITIVE PHOTOSENSITIVE RESIN COMPOSITION AND DISPLAY DEVICE USING THE SAME

(71) Applicant: DONGJIN SEMICHEM CO., LTD., Incheon (KR)

(72) Inventors: Kyoungsoon Shin, Hwaseong-si (KR); Hyoc-Min Youn, Hwaseong-si (KR); Tai Hoon Yeo, Hwaseong-si (KR); Dong Myung Kim, Hwaseong-si (KR); Gi Seon Lee, Hwaseong-si (KR); Ah Rum Park, Hwaseong-si (KR); Seok Hyeon Lee, Hwaseong-si (KR)

(73) Assignee: DONJIN SEMICHEM CO., LTD., Incheon (KR)

( * ) Notice: Subject to any disclaimer, the term of this patent is extended or adjusted under 35 U.S.C. 154(b) by 0 days.

(21) Appl. No.: 17/767,873

(22) PCT Filed: Oct. 8, 2020

(86) PCT No.: PCT/KR2020/013732
§ 371 (c)(1),
(2) Date: Apr. 8, 2022

(87) PCT Pub. No.: WO2021/071281
PCT Pub. Date: Apr. 15, 2021

(65) Prior Publication Data
US 2024/0118616 A1  Apr. 11, 2024

(30) Foreign Application Priority Data
Oct. 11, 2019 (KR) .................... 10-2019-0126256

(51) Int. Cl.
| G03F 7/022 | (2006.01) |
| G03F 7/004 | (2006.01) |
| G03F 7/031 | (2006.01) |
| G03F 7/039 | (2006.01) |
| G03F 7/075 | (2006.01) |

(52) U.S. Cl.
CPC .......... *G03F 7/0226* (2013.01); *G03F 7/0048* (2013.01); *G03F 7/022* (2013.01); *G03F 7/031* (2013.01); *G03F 7/0397* (2013.01); *G03F 7/0757* (2013.01)

(58) Field of Classification Search
CPC ............................ G03F 7/0226; G03F 7/0757
See application file for complete search history.

(56) References Cited

U.S. PATENT DOCUMENTS

| 2011/0008589 A1 | 1/2011 | Kumura et al. |
| 2015/0275042 A1 | 10/2015 | Tsai |
| 2018/0009775 A1* | 1/2018 | Tanaka ................. C07D 307/52 |
| 2019/0077961 A1* | 3/2019 | Takahashi ............. C08L 101/12 |

FOREIGN PATENT DOCUMENTS

| CN | 105759568 A | 7/2016 |
| CN | 105842988 A | 8/2016 |
| CN | 107015437 A | 8/2017 |
| CN | 110121679 A | 8/2019 |
| JP | 2017-078852 A | 4/2017 |
| JP | 2019-018449 A | 2/2019 |
| KR | 10-0945386 B1 | 3/2010 |
| KR | 10-2010-0066808 A | 6/2010 |
| KR | 10-2011-0006592 A | 1/2011 |
| KR | 10-2014-0101788 A | 8/2014 |
| KR | 10-2016-0044059 A | 4/2016 |
| KR | 10-2016-0084556 A | 7/2016 |
| KR | 10-2016-0087092 A | 7/2016 |
| KR | 10-1807308 B1 | 12/2017 |
| KR | 10-1814587 B1 | 1/2018 |
| KR | 10-2018-0103405 A | 9/2018 |
| KR | 10-2018-0111067 A | 10/2018 |
| TW | 201111915 A1 | 4/2011 |
| TW | 201809873 A | 3/2018 |
| TW | 201837065 A | 10/2018 |
| WO | 2013/012169 A3 | 3/2013 |
| WO | 2013-146130 A1 | 12/2015 |

* cited by examiner

*Primary Examiner* — John S. Chu
(74) *Attorney, Agent, or Firm* — United One Law Group LLC; Kongsik Kim; Jhongwoo Peck

(57) ABSTRACT

This invention relates to a positive photosensitive resin composition that includes a siloxane copolymer of two kinds of reactive silane compounds with specific structures wherein residual impurities such as unreacted monomers and catalysts are minimized, and a UV absorber including one or more kinds of phenol hydroxyl groups capable of crosslinking and an alkoxy group. Accordingly, the resin composition exhibits excellent performances such as sensitivity, resolution, and degree of planarization, and also has excellent weatherability and UV absorbance, thereby providing excellent panel reliability.

17 Claims, 1 Drawing Sheet

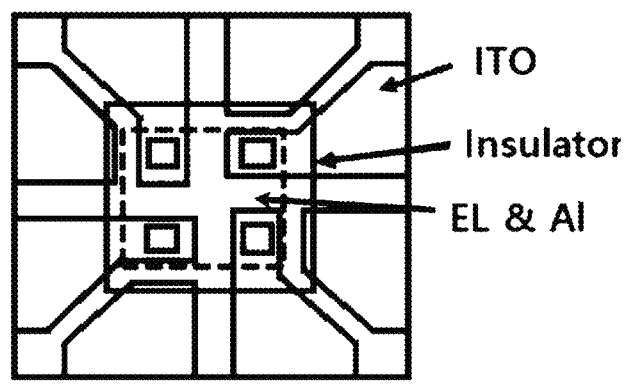

POSITIVE PHOTOSENSITIVE RESIN COMPOSITION AND DISPLAY DEVICE USING THE SAME

CROSS-REFERENCE TO RELATED APPLICATION(S)

This application is a National Stage Entry of International Application No. PCT/KR2020/013732 filed on Oct. 8, 2020, which claims priority from Korean Application No. 10-2019-0126256 filed on Oct. 11, 2019. The aforementioned applications are incorporated herein by reference in their entireties.

TECHNICAL FIELD

This invention relates to a positive photosensitive resin composition, more specifically to a positive photosensitive resin composition that can realize high resolution as well as insulation and heat resistance of organic light emitting diode (OLED) display devices, can form environment-resistant patterns due to excellent light resistance and heat resistance, and has reduced pattern defects caused by solubility differences generated at the boundary of exposed and non-exposed parts or residues after development.

BACKGROUND ART

In recent display industries, OLED devices displaying images through self-emitting organic layer without a backlight unit (BLU) are being developed from liquid display devices displaying images through a separate light source such as a BLU. Particularly, the OLED display device is being applied for large electronic devices such as TVs as well as small electronic devices such as smart phones. Further, since an OLED display device can flexibly realize a panel on which an organic light emitting layer is deposited, it is bendable, and thus can be applied for various shapes of display devices for such as outdoor advertisement, automobiles, and the like.

An OLED display includes a Pixel Defining Layer (PDL) dividing boundaries between red, green, and blue pixels and insulating each of them, and an interlayer dielectric having both an insulation property and an electrode planarization property at the bottom of the PDL layer. Herein, the PDL layer is precisely patterned through a photolithography process, and thus, as the material for forming the PDL layer, previously, photosensitive resin compositions containing polyamic acid compounds were widely used.

However, a photosensitive resin composition including polyamic acid and polyimide generally has insufficient sensitivity compared to a photosensitive resin composition including siloxane resin, and has a high rate of thickness change during the process, and thus, the productivity is inadequate. Since the main function of PDL for forming uniform red, green, and blue pixels of different sizes, namely, resolution, is inadequate, the quality of the final display device panel may be influenced. Further, the insoluble property of polyimide resin may cause residues after development.

Further, as the supply of displays exposed to sunlight and various weather such as large advertisements or automobiles are spread, there is a demand for development of display devices having improved weatherability.

SUMMARY

Technical Problem

In order to solve the problems of the prior art, it is an object of the invention to provide a positive photosensitive resin composition that not only has excellent performances such as sensitivity, resolution, and degree of planarization, and the like, but also has excellent weatherability, thus securing excellent panel reliability, and thus, can be usefully applied for an interlayer dielectric, a planarization layer, PDL, and the like in various OLED displays, and a method for forming a pattern of a display device and a positive photosensitive siloxane resin composition using the same.

Technical Solution

According to an embodiment of the invention, there is provided a positive photosensitive resin composition including:
a) siloxane-based copolymer;
b) a 1,2-quinone diazide compound;
c) one or more kinds of UV absorbers represented by the following Chemical Formula 1; and
d) a solvent:

[Chemical Formula 1]

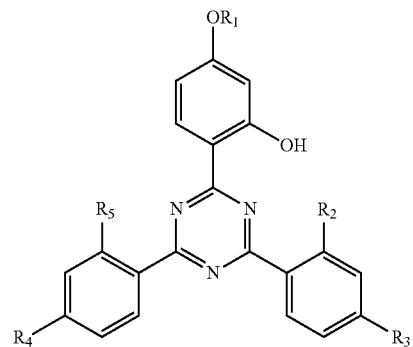

in Chemical Formula 1,
$R_1$ is one or more functional groups selected from the group consisting of hydrogen, a substituted or unsubstituted C1-20 alkyl, a substituted or unsubstituted C3-20 cycloalkyl, a substituted or unsubstituted C2-10 alkenyl, a substituted or unsubstituted C6-18 aryl, a substituted or unsubstituted C7-18 alkylaryl, a substituted or unsubstituted C7-18 arylalkyl, a substituted or unsubstituted C1-20 alkoxy, a substituted or unsubstituted C1-30 acetal, a substituted or unsubstituted C1-30 hemiacetal, a substituted or unsubstituted C1-20 heteroalkyl, a substituted or unsubstituted C3-20 cycloheteroalkyl, a substituted or unsubstituted C2-10 heteroalkenyl, a substituted or unsubstituted C6-18 heteroaryl, a substituted or unsubstituted C7-18 heteroalkylaryl, a substituted or unsubstituted C7-18 heteroarylalkyl, a substituted or unsubstituted C1-20 heteroalkoxy, a substituted or unsubstituted C1-30 heteroacetal, and a substituted or unsubstituted C1-30 heterohemiacetal, $R_2$ to $R_5$ may be identical to or different from one another, and are each independently one or more functional groups selected from the group consisting of hydrogen, hydroxy, a substituted or unsubstituted C1-20 alkyl, a substituted or unsubstituted C3-20 cycloalkyl, a substituted or unsubstituted C2-10 alkenyl, a substituted or unsubstituted C6-18 aryl, a substituted or unsubstituted C7-18 alkylaryl, a substituted or unsubstituted C7-18 arylalkyl, a substituted or unsubstituted C1-20 alkoxy, a substituted or unsubstituted C1-30 acetal, a substituted or unsubstituted C1-30 hemiacetal, a substituted or unsubstituted C1-20 heteroalkyl, a substituted or unsubstituted C3-20 cycloheteroalkyl, a substituted or unsubstituted C2-10 heteroalkenyl, a substituted or unsubstituted C6-18 heteroaryl, a substituted or unsubstituted C7-18 heteroalkylaryl, a substituted or unsubstituted C7-18 heteroarylalkyl, a substituted or unsubstituted C1-20 heteroalkoxy, a substituted or unsubstituted C1-30 heteroacetal, and a substituted or unsubstituted C1-30 heterohemiacetal.

According to another embodiment of the invention, there is provided a cured film including the cured body of the positive photosensitive resin composition.

According to yet another embodiment of the invention, there is provided a display device including the cured body of the positive photosensitive resin composition.

Advantageous Effects

The positive photosensitive resin composition including a siloxane-based copolymer according to the invention uses a UV absorber of a specific structure wherein the contents of unreacted monomers and catalysts are minimized, thereby exhibiting an excellent insulation property of siloxane, heat resistance enabling maintenance of a stable shape even up to about 350° C., and low moisture absorption, and the like. Thus, the invention can provide a PDL layer that divides boundaries between pixels of a display device such as an OLED, and an interlayer dielectric having both insulation property and electrode planarization property at the bottom of the PDL layer, and thus can remarkably reduce fraction of defectives due to moisture influencing the operation reliability of an OLED panel.

BRIEF DESCRIPTION OF THE DRAWINGS

FIG. 1 schematically shows a pattern substrate for evaluating OLED reliability for examples and comparative examples.

DETAILED DESCRIPTION

Hereinafter, the invention will be explained in detail. The terms or words used in the specification and claims should not be limitedly interpreted as common or dictionary meanings, and should be interpreted as meanings and concepts corresponding to the technical idea of the invention, based on a principle that the inventor can appropriately define the concept of a term to explain their own invention in the best way.

Further, the meaning of the term "comprise" used in the specification embodies specific characteristics, areas, essences, steps, actions, elements, and/or components, and does not exclude existence or addition of other specific characteristics, areas, essences, steps, actions, elements, and/or components.

According to an embodiment of the invention, there is provided a positive photosensitive resin composition including: a) a siloxane-based copolymer; b) a 1,2-quinone diazide compound; c) one or more kinds of UV absorbers represented by the following Chemical Formula 1; and d) a solvent.

[Chemical Formula 1]

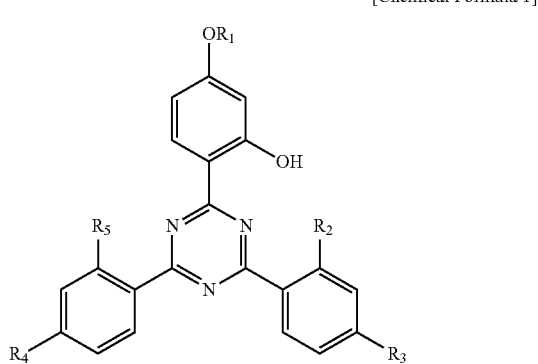

In Chemical Formula 1, $R_1$ is one or more functional groups selected from the group consisting of hydrogen, a substituted or unsubstituted C1-20 alkyl, a substituted or unsubstituted C3-20 cycloalkyl, a substituted or unsubstituted C2-10 alkenyl, a substituted or unsubstituted C6-18 aryl, a substituted or unsubstituted C7-18 alkylaryl, a substituted or unsubstituted C7-18 arylalkyl, a substituted or unsubstituted C1-20 alkoxy, a substituted or unsubstituted C1-30 acetal, a substituted or unsubstituted C1-30 hemiacetal, a substituted or unsubstituted C1-20 heteroalkyl, a substituted or unsubstituted C3-20 cycloheteroalkyl, a substituted or unsubstituted C2-10 heteroalkenyl, a substituted or unsubstituted C6-18 heteroaryl, a substituted or unsubstituted C7-18 heteroalkylaryl, a substituted or unsubstituted C7-18 heteroarylalkyl, a substituted or unsubstituted C1-20 heteroalkoxy, a substituted or unsubstituted C1-30 heteroacetal, and a substituted or unsubstituted C1-30 heterohemiacetal, $R_2$ to $R_5$ may be identical to or different from one another, and are each independently one or more functional groups selected from the group consisting of hydrogen, hydroxy, a substituted or unsubstituted C1-20 alkyl, a substituted or unsubstituted C3-20 cycloalkyl, a substituted or unsubstituted C2-10 alkenyl, a substituted or unsubstituted C6-18 aryl, a substituted or unsubstituted C7-18 alkylaryl, a substituted or unsubstituted C7-18 arylalkyl, a substituted or unsubstituted C1-20 alkoxy, a substituted or unsubstituted C1-30 acetal, a substituted or unsubstituted C1-30 hemiacetal, a substituted or unsubstituted C1-20 heteroalkyl, a substituted or unsubstituted C3-20 cycloheteroalkyl, a substituted or unsubstituted C2-10 heteroalkenyl, a substituted or unsubstituted C6-18 heteroaryl, a substituted or unsubstituted C7-18 heteroalkylaryl, a substituted or unsubstituted C7-18 heteroarylalkyl, a substituted or unsubstituted C1-20 heteroalkoxy, a substituted or unsubstituted C1-30 heteroacetal, and a substituted or unsubstituted C1-30 heterohemiacetal.

The positive photosensitive resin composition of the invention includes a UV absorber including one or more phenol hydroxyl groups capable of crosslinking reaction and having an alkoxy group, unlike the conventional benzotriazole, and thereby has excellent performances such as sensitivity, resolution, planarization characteristic, and the like, and simultaneously, has excellent weatherability and UV absorbance, thus securing excellent panel reliability.

Further, the positive photosensitive siloxane composition of the invention includes siloxane resin for forming an insulation layer that can realize high resolution, as well as insulation property and heat resistance of OLED display devices.

More specifically, the photosensitive resin composition according to the invention may use a siloxane copolymer of two kinds of reactive silane compounds with specific structures wherein residual impurities such as unreacted monomers and catalysts are minimized, can form environment-resistant patterns due to excellent light resistance and heat resistance, and can reduce pattern defects that may occur due to solubility differences generated at the boundary of exposed and non-exposed parts or residue after development.

Further, the invention also relates to a cured body formed from the positive photosensitive resin composition, and a display device including the cured body.

Hereinafter, the siloxane-based copolymer, a 1,2-quinone diazide compound, a UV absorber, and a solvent used in the positive photosensitive resin composition of the invention, will be explained in detail.

a) Siloxane-Based Copolymer

The siloxane-based copolymer according to the invention, when used in a photosensitive resin composition, not only has excellent performances such as sensitivity, resolution, and the like, but also maintains low moisture absorption, thereby contributing to securing of excellent panel reliability.

Such siloxane-based copolymer may be obtained by hydrolysis and condensation polymerization of i) a silane compound represented by the following Chemical Formula 2, and ii) a silane compound represented by the following Chemical Formula 3, and removing impurities such as unreacted monomers and the like.

According to an embodiment, the siloxane-based copolymer may be obtained by hydrolysis and condensation polymerization of i) 10 to 90 parts by weight of a silane compound represented by the following Chemical Formula 2, and ii) 10 to 90 parts by weight of a silane compound represented by the following Chemical Formula 3, based on 100 parts by weight of total monomers.

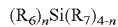 [Chemical Formula 2]

in Chemical Formula 2, $R_6$'s may be identical to or different from one another, and are each independently hydrogen, a C1-10 alkyl, a C2-10 acyl, a C2-10 alkenyl, or a C6-20 aryl group, $R_7$'s may be identical to or different from one another, and are each independently, hydrogen, alkoxy, or chloro, n is an integer of 1 to 3,

 [Chemical Formula 3]

in Chemical Formula 3, $R_8$'s may be identical to or different from one another, and are each independently, methyl, ethyl, propyl, isopropyl, or butyl.

The silane compound represented by Chemical Formula 2 is reactive silane, and for example, phenyltrimethoxysilane, diphenyldimethoxysilane, methyltrimethoxysilane, dimethyldiphenylmethoxysilane, 1-naphthyltrimethoxysilane, propyltrimethoxysilane, octyltrimethoxysilane, and the like may be used, and these compounds may be used alone or in combination of two or more kinds.

The reactive silane represented by Chemical Formula 2 may be used in an amount of 10 to 90 parts by weight, based on 100 parts by weight of total monomers. If the content of the silane represented by Chemical Formula 2 is less than 10 parts by weight, cracks may be generated when forming a cured body, and if the content is greater than 90 parts by weight, it may be difficult to realize high resolution due to pattern sagging.

Further, the compound represented by Chemical Formula 3 is tetrafunctional reactive silane, and for example, tetramethoxy silane, tetraethoxysilane, tetrapropoxy silane, and the like may be used, and these compounds may be used alone or in combination of two or more kinds.

The reactive silane represented by Chemical Formula 3 may be used in an amount of 10 to 90 parts by weight, based on 100 parts by weight of total monomers. If the content of the silane represented by Chemical Formula 3 is less than 10 parts by weight, a dissolution rate in a developer may be too slow, which is unfavorable in terms of sensitivity, and if the content is greater than 90 parts by weight, precipitation may be generated due to low solubility in a solvent used in a composition.

The conditions of hydrolysis and condensation polymerization for preparing the siloxane-based copolymer are not significantly limited, and they may be conducted under conditions that are well known in the art. For example, the polymerization reaction may be progressed at a temperature of 50 to 100° C. for 4 to 24 hours. Further, the reaction may be progressed under an inert atmosphere.

Further, during the hydrolysis and condensation polymerization, an acid or base catalyst may be additionally used. The acid catalyst that can be used may be hydrochloric acid, nitric acid, sulfuric acid, phosphoric acid, acetic acid, oxalic acid, formic acid, acetic acid, propionic acid, butanoic acid, pentanoic acid, and the like, and the base catalyst may be sodium hydroxide, potassium hydroxide, ammonia, an organic amine, and an alkylammonium hydroxide salt, and these compounds may be used alone or two or more kinds of the compounds may be combined and used simultaneously or in stages.

Further, after the condensation polymerization is completed, unreacted monomers and catalysts may be removed through water and organic solvent extraction.

The siloxane-based copolymer prepared by such a method may include a copolymer having an unreacted monomer content less than 10 wt %, and residual catalyst content less than 2000 ppm. The siloxane-based copolymer from which unreacted monomers and catalysts have been removed has improved storage stability, and residue after development due to side reactions may be improved during a curing process of the photosensitive resin composition. Herein, in case the catalyst content is 2000 ppm or more, due to residual catalysts, sensitivity may become slow, or corrosion of upper or lower metal wires may be generated due to diffusion. Thus, when using the siloxane-based copolymer, the catalyst content should be within a specific range, so as to achieve desired effects.

Further, the finally obtained siloxane-based copolymer may have polystyrene-converted weight average molecular weight (Mw) of 1000 g/mol to 30,000 g/mol. The polystyrene-converted weight average molecular weight (Mw) may be measured by a standard analysis method of a gel permeation chromatography (GPC) system using Waters Corp. e2695 Alliance Separation Module.

If the polystyrene-converted weight average molecular weight (Mw) of the siloxane-based copolymer is less than 1000 g/mol, a retention rate may be lowered during a development process, or heat resistance may be degraded and moisture absorption may be unsatisfactory. Further, if the polystyrene-converted weight average molecular weight (Mw) of the siloxane-based copolymer is greater than 30,000 g/mol, the sensitivity and development property of the positive photosensitive resin composition may be deteriorated.

b) 1,2-quinonediazide Compound

The photosensitive resin composition including the 1,2-quinonediazide compound according to the invention forms a positive pattern in which exposed parts are soluble in a developer and can be removed by a development process.

The 1,2-quinonediazide compound has a structure in which a ballast includes a phenol hydroxyl group and naphthoquinone diazide sulfonic acid that are ester bonded.

As the naphthoquinone diazide sulfonic acid, 4-naphthoquinone diazide sulfonic acid halide or 5-naphthodiazide sulfonic acid halide may be used. An ester compound obtained from the 4-naphthoquinone diazide sulfonic acid halide is suitable for i ray exposure because there is absorption in an i ray (wavelength 365 nm) region. Further, an ester compound obtained from 5-naphthoquinone diazide sulfonic acid halide is suitable for exposure at a wide wavelength because there are absorptions in wide wavelength regions. The 4- or 5-naphthoquinone diazidesulfonic acid compound may be selected or used in combination according to an exposure wavelength.

Further, the optimal content of the 1,2-quinonediazide compound may vary based on esterification rate of naphthoquinone diazidosulfonic acid or properties of siloxane-based copolymer used, required sensitivity, and contrast due to solubility difference between exposed and non-exposed parts. Specifically, the 1,2-quinonediazide compound may be included in an amount of 5 to 50 parts by weight or 10 to 35 parts by weight, based on 100 parts by weight of the siloxane-based copolymer. When the 2-quinonediazide compound is included in an amount of 5 to 50 parts by weight, the patterning property may become satisfactory by a solubility difference between exposed and non-exposed parts.

Herein, if the content of the 1,2-quinonediazide compound is less than 5 parts by weight, solubility contrast between exposed and non-exposed parts may be lowered, and thus photosensitivity may not be obtained. Meanwhile, if the content of the 1,2-quinonediazide compound is 50 parts by weight or more, compatibility may be lowered, and thus whitening may occur, or by decomposition of the quinonediazide compound during a heat curing process, the insulation property of the cured product may be deteriorated or a gas component of the decomposition product may cause process problems.

c) UV Absorber

The composition of the invention specifically includes a UV absorber represented by the following Chemical Formula 1.

[Chemical Formula 1]

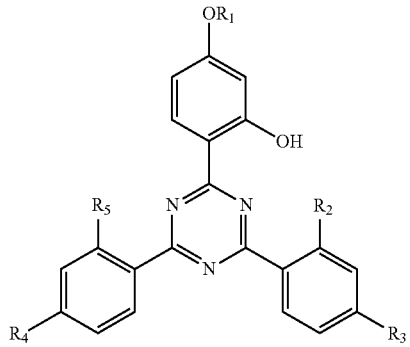

In Chemical Formula 1,
$R_1$ is one or more functional groups selected from the group consisting of hydrogen, a substituted or unsubstituted C1-20 alkyl, a substituted or unsubstituted C3-20 cycloalkyl, a substituted or unsubstituted C2-10 alkenyl, a substituted or unsubstituted C6-18 aryl, a substituted or unsubstituted C7-18 alkylaryl, a substituted or unsubstituted C7-18 arylalkyl, a substituted or unsubstituted C1-20 alkoxy, a substituted or unsubstituted C1-30 acetal, a substituted or unsubstituted C1-30 hemiacetal, a substituted or unsubstituted C1-20 heteroalkyl, a substituted or unsubstituted C3-20 cycloheteroalkyl, a substituted or unsubstituted C2-10 heteroalkenyl, a substituted or unsubstituted C6-18 heteroaryl, a substituted or unsubstituted C7-18 heteroalkylaryl, a substituted or unsubstituted C7-18 heteroarylalkyl, a substituted or unsubstituted C1-20 heteroalkoxy, a substituted or unsubstituted C1-30 heteroacetal, and a substituted or unsubstituted C1-30 heterohemiacetal, $R_2$ to $R_5$ may be identical to or different from one another, and are each independently one or more functional groups selected from the group consisting of hydrogen, hydroxy, a substituted or unsubstituted C1-20 alkyl, a substituted or unsubstituted C3-20 cycloalkyl, a substituted or unsubstituted C2-10 alkenyl, a substituted or unsubstituted C6-18 aryl, a substituted or unsubstituted C7-18 alkylaryl, a substituted or unsubstituted C7-18 arylalkyl, a substituted or unsubstituted C1-20 alkoxy, a substituted or unsubstituted C1-30 acetal, a substituted or unsubstituted C1-30 hemiacetal, a substituted or unsubstituted C1-20 heteroalkyl, a substituted or unsubstituted C3-20 cycloheteroalkyl, a substituted or unsubstituted C2-10 heteroalkenyl, a substituted or unsubstituted C6-18 heteroaryl, a substituted or unsubstituted C7-18 heteroalkylaryl, a substituted or unsubstituted C7-18 heteroarylalkyl, a substituted or unsubstituted C1-20 heteroalkoxy, a substituted or unsubstituted C1-30 heteroacetal, and a substituted or unsubstituted C1-30 heterohemiacetal.

Herein, the functional groups $R_1$ to $R_5$, i.e., alkyl, cycloalkyl, alkenyl, aryl, alkylaryl, or arylalkyl, may be substituted with a hydroxy group, a halogen atom, or a C1-12 alkyl or alkoxy group.

Further, the functional groups $R_1$ to $R_5$, i.e., alkyl, cycloalkyl, alkenyl, aryl, alkylaryl, or arylalkyl, may be interrupted by an oxygen atom, a sulfur atom, a carbonyl group, an ester group, an amide group, or an imino group.

Further, the substitution and interruption of the functional groups $R_1$ to $R_5$ by each substituent may be combined.

In addition, the alkyl group may mean a linear or branched alkyl group.

In Chemical Formula 1, $R_1$ may be a substituted or unsubstituted C1-20 alkyl group, $R_2$ to $R_4$ may each independently or simultaneously be one or more functional groups selected from hydrogen and a substituted or unsubstituted C1-20 alkoxy group, and $R_5$ may be a hydroxy group.

In Chemical Formula 1, $R_1$ may be one or more functional groups selected from a substituted or unsubstituted C1-20 alkyl, a substituted or unsubstituted C1-30 acetal group, and a substituted or unsubstituted C1-30 hemiacetal group, and $R_2$ to $R_5$ may each independently or simultaneously be a substituted or unsubstituted C1-20 alkyl group. The alkyl groups, which are the functional groups of $R_1$, may each independently or simultaneously be substituted with a hydroxy group or a C1-12 alkyl or alkoxy group, or interrupted by an oxygen atom, a carbonyl group, or an ester group.

In Chemical Formula 1, $R_1$ may be one or more functional groups selected from a substituted or unsubstituted C1-20 alkyl, a substituted or unsubstituted C1-30 acetal, and a substituted or unsubstituted C1-30 hemiacetal, $R_2$ and $R_3$ may each independently be hydrogen, $R_4$ and $R_5$ may each independently or simultaneously be one or more functional groups selected from hydrogen, a substituted or unsubstituted C6-18 aryl, a substituted or unsubstituted C7-18 alkylaryl, and a substituted or unsubstituted C7-18 arylalkyl. The alkyl groups, which are the functional groups of $R_1$, may each independently or simultaneously be substituted with a hydroxy group or a C1-12 alkyl or alkoxy group, or interrupted by an oxygen atom, a carbonyl group, or an ester group. Further, it is more preferable that the $R_4$ and $R_5$ are each independently or simultaneously a substituted or unsubstituted C6-18 aryl group.

In Chemical Formula 1, $R_1$ may be a substituted or unsubstituted C1-20 alkyl group, and $R_2$ to $R_5$ may each independently or simultaneously be one or more functional groups selected from the group consisting of hydrogen and a substituted or unsubstituted C1-20 alkyl group.

A cured film obtained using a photosensitive resin composition including such a UV absorber has excellent sensitivity, resolution, transmittance, and light fastness, crack-resistance, and simultaneously can improve OLED reliability. Further, when the photosensitive resin composition is used, due to excellent solubility, precipitation and whitening may not occur, thereby improving coating property.

Specifically, in the case of the conventional positive photosensitive composition, a composition consisting of an alkali soluble resin and a 1,2-quinonediazide compound is thermally decomposed when hard baked after exposure and development. Thus, light transmittance at the visible ray region may be lowered, or in case a cured film is exposed to heat beyond a certain temperature or absorbs short wavelength light of high energy such as UV, a part of the components of the cured film may be decomposed to generate discoloration, or impurities may be generated, thus generating reliability problems of organic EL devices.

Further, in general, in the conventional photosensitive composition, a benzotriazole-based compound is used as a UV absorber, but it has a limitation in prevention of discoloration of a cured film, and has problems in terms of resolution, whitening, and the like.

Thus, this invention uses a material having a triazine-based backbone of Chemical Formula 1 as explained, and specifically including one or more phenol hydroxyl groups and alkoxy group as functional groups, as a UV absorber, thereby preventing discoloration of a cured film and providing excellent light resistance and satisfactory heat resistance effects.

Further, the UV absorber of the invention has a higher molar extinction coefficient than previously-used benzotriazole-based compounds, and thus, when used in the same amount, UV absorption property is enhanced. Further, the UV absorber of Chemical Formula 3 has one or more phenol hydroxyl groups and an alkoxy group, and when heat treated with a compound having an alkoxy group such as siloxane resin, a crosslinking reaction occurs. Through the crosslinking reaction, it may remain stable during additional heat treatment or long-term storage, visible ray exposure of the cured film, and the like. Further, the UV absorber has good heat resistance.

Such a UV absorber may be included in an amount of 0.1 to 10 parts by weight or 5 to 10 parts by weight, based on 100 parts by weight of the siloxane-based copolymer. If the content of the UV absorber is less than 0.1 parts by weight, light resistance may not be sufficient, and if the content is greater than 10 parts by weight, sensitivity may be lowered, and thus it may be difficult to realize patterns.

The UV absorber and 1,2-quinonediazide compound may be included at the weight ratio of 1:1 to 1:20. If the above content ratio is not fulfilled, light resistance may not be sufficient, or sensitivity may be lowered.

Further, the UV absorber may have absorption regions at 400 nm or less or 280 nm to 380 nm. Specifically, if the UV absorber is included in an amount of 0.1 to 10 parts by weight based on the photosensitive resin, it may have absorption regions at 400 nm or less or 280 nm to 380 nm.

Examples of such UV absorber may be one or more selected from the compounds represented by the following Chemical Formulas 4 and 5, Chemical Formula 6-1, Chemical Formula 6-2, and Chemical Formulas 7 to 12, but the kind is not limited as long as it is included in the definition of Chemical Formula 1 as explained above.

[Chemical Formula 4]

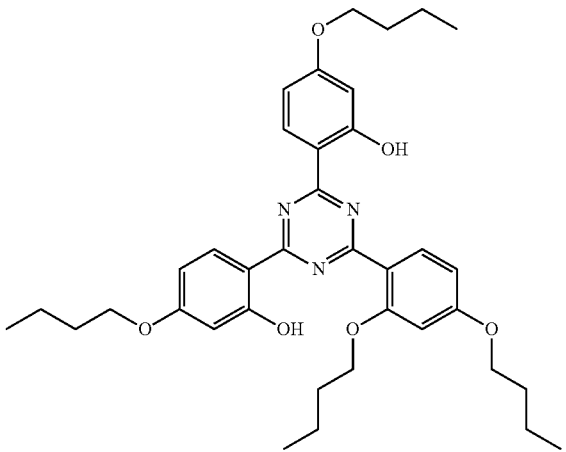

Chemical Formula 4 has a structure of Chemical Formula 1 wherein $R_1$ is propyl, $R_2$, $R_3$, and $R_4$ are each independently butoxy, and $R_5$ is hydroxyl, and has a maximum absorption wavelength at 350 nm.

[Chemical Formula 5]

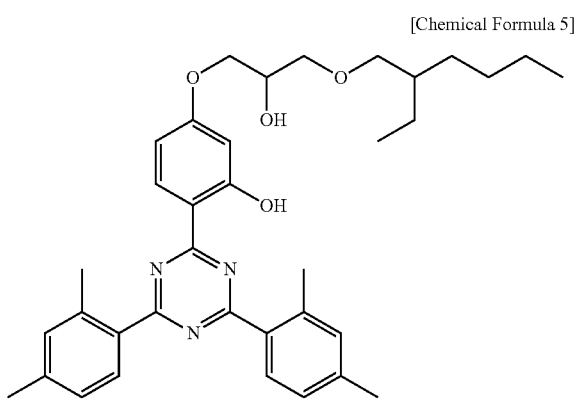 [SMILES: CCCCC(CC)COCC(O)COc1ccc(-c2nc(-c3ccc(C)cc3C)nc(-c3ccc(C)cc3C)n2)c(O)c1]

Chemical Formula 5 has a structure of Chemical Formula 1 wherein $R_1$ is 4-[3-(2-ethylhexyl-1-oxy)-2-hydroxypropyl], and $R_2$, $R_3$, $R_4$, and $R_5$ are each independently methyl, and has a maximum absorption wavelength at 295 nm.

[Chemical Formula 6]

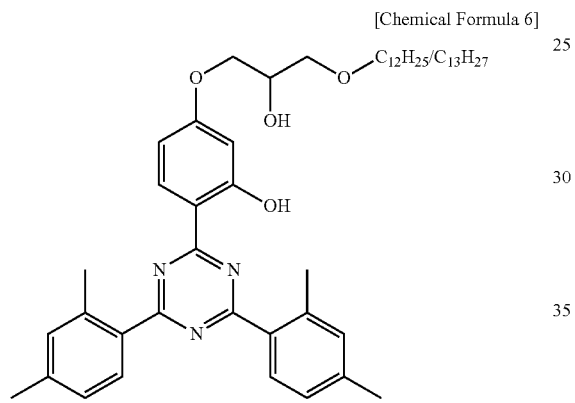

Chemical Formula 6 includes structures of Chemical Formula 1 wherein $R_1$ is 4-[2-hydroxy-3-tridecyloxypropyl] and 4-[2-hydroxy-3-dodecyloxypropyl], and has a structure wherein $R_2$, $R_3$, $R_4$, and $R_5$ are each independently methyl, and has a maximum absorption wavelength at 295 nm.

Namely, Chemical Formula 6 consists of a mixture of the following Chemical Formulas 6-1 and 6-2. The mixing ratio of the mixture of Chemical Formula 6-1 and 6-2 is not specifically limited, and for example, the weight ratio may be 1:99-99:1.

[Chemical Formula 6-1]

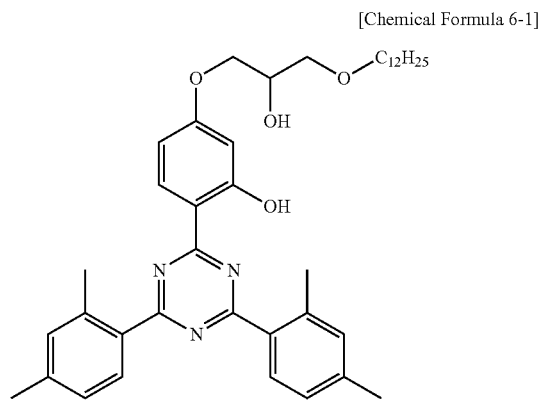

[Chemical Formula 6-2]

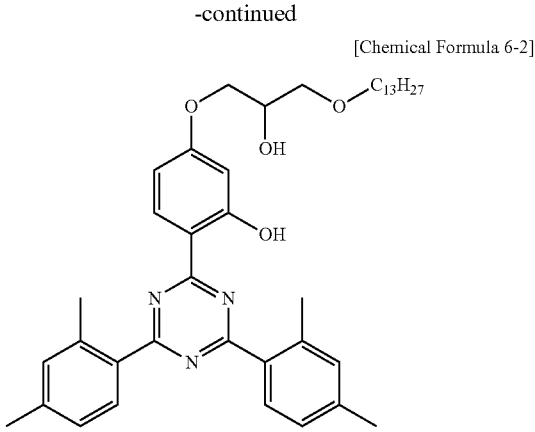

[Chemical Formula 7]

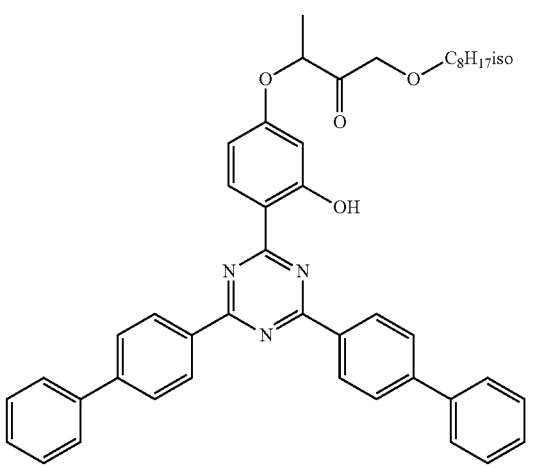

Chemical Formula 7 has a structure of Chemical Formula 1 wherein $R_1$ is isooctylpropanoate, $R_2$ and $R_3$ are each independently hydrogen, and $R_4$ and $R_5$ are each independently phenyl, and has a maximum absorption wavelength at 322 nm.

[Chemical Formula 8]

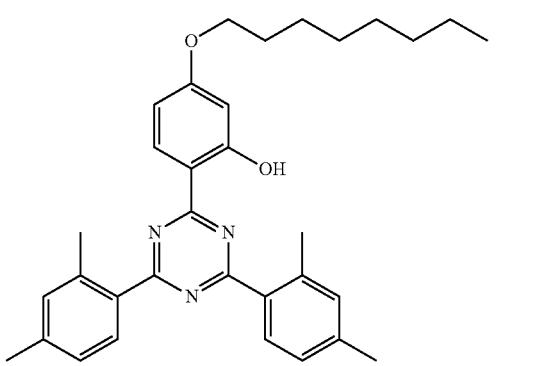

Chemical Formula 8 has a structure of Chemical Formula 1 wherein $R_1$ is octyl, and $R_2$, $R_3$, $R_4$, and $R_5$ are each independently methyl, and has a maximum absorption wavelength at 287 nm.

[Chemical Formula 9]

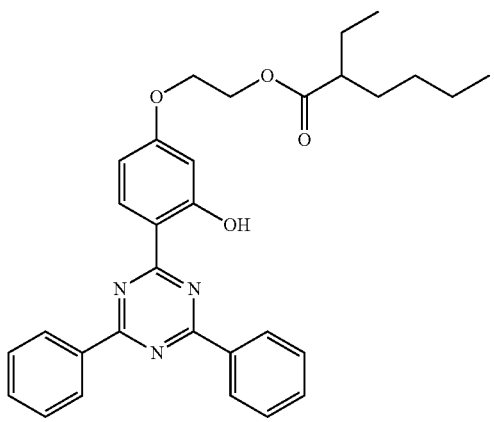

Chemical Formula 9 has a structure of Chemical Formula 1 wherein $R_1$ is 2-(2-ethylhexanoyloxy)ethyl, and $R_2$, $R_3$, $R_4$, and $R_5$ are each independently hydrogen, and has a maximum absorption wavelength at 287 nm.

[Chemical Formula 10]

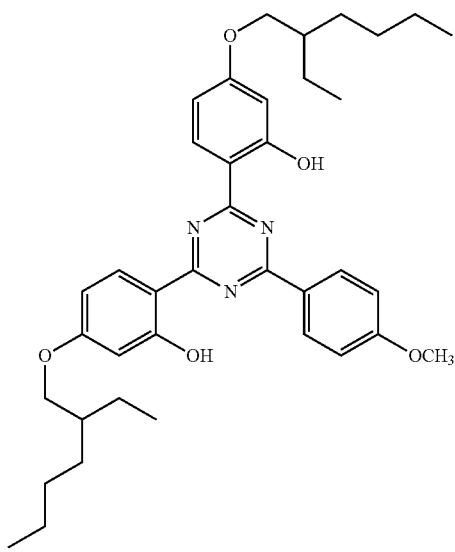

Chemical Formula 10 has a structure of Chemical Formula 1 wherein $R_1$ is 2-ethylhexyl $R_2$ is hydrogen, $R_3$ is methoxy, $R_4$ is 2-ethylhexyloxy, and $R_5$ is hydroxyl, and has a maximum absorption wavelength at 340 nm.

[Chemical Formula 11]

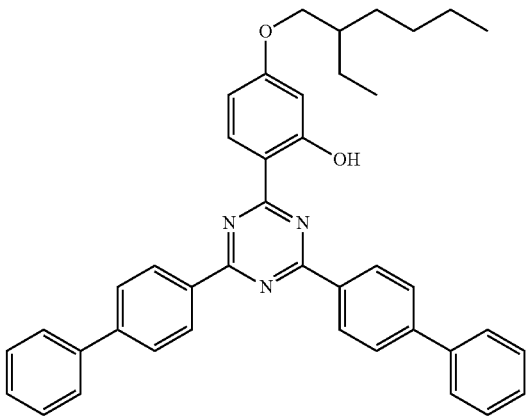

Chemical Formula 11 has a structure of Chemical Formula 1 wherein $R_1$ is 2-ethylhexyl, $R_2$ and $R_5$ are each independently hydrogen, and $R_4$ and $R_5$ are each independently phenyl, and has a maximum absorption wavelength at 370 nm.

[Chemicl Formula 12]

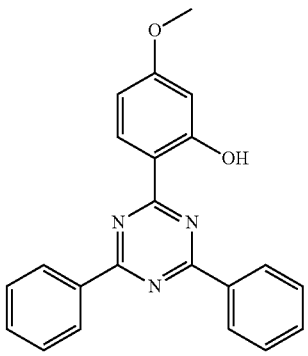

Chemical Formula 12 has a structure of Chemical Formula 1 wherein $R_1$ is methyl, and $R_2$, $R_3$, $R_4$, and $R_5$ are each independently hydrogen, and has a maximum absorption wavelength at 290 nm.

The UV absorber may be used as a mixture of two kinds. For example, a mixture of i) one selected from the group consisting of a mixture of Chemical Formula 4, Chemical Formula 5, Chemical Formula 6-1 and Chemical Formula 6-2, and Chemical Formula 8, and ii) one selected from the group consisting of Chemical Formula 7, Chemical Formula 9, and Chemical Formula 10, may be used.

For another example, as the UV absorber, a mixture of iii) one selected from the group consisting of Chemical Formula 9 and Chemical Formula 10, and iv) one selected from the group consisting of Chemical Formula 11 and Chemical Formula 12, may be used.

In case the two UV absorbers are used, the mixing ratio of i) and ii) or iii) and iv) may be between 25:75 and 75:25 (wt %), based on the total amount of the UV absorber used.

d) Solvent

In the positive photosensitive resin composition of the invention, the solvent may be used in such an amount that the solid content of the resin composition may become 10 to 90 wt %. Thus, the content of the solvent may be appropriately controlled within a range fulfilling the solid content range.

As the d) solvent, one or more selected from the group consisting of methanol, ethanol, benzyl alcohol, hexyl alcohol, ethylene glycol methylether acetate, ethylene glycol ethyletheracetate, ethylene glycol methylether propionate, ethylene glycol ethylether propionate, ethylene glycol methylether, ethylene glycol ethylether, diethylene glycol monomethylether, diethylene glycol monoethylether, diethylene glycol dimethylether, diethylene glycol methyl ethylether, propylene glycol methylether acetate, propylene glycol ethylether acetate, propylene glycol propylether acetate, propylene glycol methylether propionate, propylene glycol ethylether propionate, propylene glycol propylether propionate, propylene glycol methylether, propylene glycol ethylether, propylene glycol propylether, propylene glycol butylether, dipropylene glycol dimethylether, dipropylene glycol diethylether, butylene glycol monomethyl ether, butylene glycol monoethylether, dibutylene glycol dimethylether, and dibutylene glycol diethylether may be used.

e) Other Additives

The positive photosensitive resin composition according to the invention may further include surfactants within a range where the effects of the invention are not damaged. As such a surfactant, fluorine-based surfactants, silicon-based surfactants, non-ionic surfactants, and other surfactants may be used.

Further, in order to improve chemical resistance and layer adhesion of the invention, a silane coupling agent crosslinking with hydroxyl groups or promoting crosslinking, a crosslinking agent, a crosslinking accelerator, a sensitizer, a thermal radical generator, a thermal acid or thermal base generator, a photoacid or photo base generator, a dissolution accelerator, a dissolution inhibitor, a stabilizer, a defoaming agent, and the like may be included as necessary, within a range where the effects of the invention are not damaged.

Further, the content of the surfactant and additives are not specifically limited, and may be used according to common knowledge in the art.

Thus, for specific example, the positive photosensitive resin composition of the invention may include a) siloxane-based copolymer, b) a 1,2-quinonediazide compound, (c) a UV absorber, and (d) a solvent, and may further include one or more selected from a surfactant and other additives so as to improve coating property.

It is preferable that the above explained components are mixed, and then the solution of the positive photosensitive resin composition is filtered using a 0.1 μm filter before use.

If a cured film is formed using the photosensitive resin composition of the invention, a cured film having transmittance of 80% or more and less than 95% at 400 nm, based on a film thickness of 3 μm, may be formed.

Method for Forming Pattern of Display Device and Display Device Using the Same

Meanwhile, according to another embodiment of the invention, there is provided a cured film including a cured body of the above-explained positive photosensitive resin composition.

Further, there is provided a display device including the cured body of the positive photosensitive resin composition.

According to the invention, there is also provided a method for forming a display device pattern using the positive photosensitive resin composition.

An OLED display includes a Pixel Defining Layer (PDL) dividing boundaries between red, green, and blue pixels and insulating each of them, and an interlayer dielectric having both an insulation property and an electrode planarization property at the bottom of the PDL layer. Herein, the PDL layer is precisely patterned through a photolithography process, and thus, as the material for forming the PDL layer, previously, photosensitive resin compositions containing polyamic acid compounds were widely used.

Thus, according to the invention, a cured film including a cured body of the positive photosensitive resin composition having a specific composition as explained above may be formed, and various display devices including a pattern of the cured film may be provided.

Specifically, a cured film including a cured body of the resin composition may be formed by coating the positive photosensitive resin composition on a semiconductor substrate to a certain thickness, and pre-drying in a vacuum chamber, and then pre-baking with a hot plate or oven, and the like.

The semiconductor substrate may be, for example, a silicon substrate, a silicon nitride substrate, a substrate coated with a metal, for example, aluminum, molybdenum, chromium, and the like, a glass substrate, a quartz substrate, an ITO substrate, and the like. The coating may be conducted by rotary coating, slit coating, rotary coating after slit, ink jet coating, and the like.

The heat treatment condition may adopt, for example, an optimal heating temperature and heating time selected from 70° C. to 150° C. and 0.5 minutes to 30 minutes.

Further, the thickness of the cured film formed from the positive photosensitive resin composition may be 0.1 μm to 20 μm. The cured film may have transmittance of 80% or more and less than 95% at the wavelength of 400 nm, based on the film thickness of 3 μm.

Since the cured film of the invention is formed from the photosensitive resin composition including a UV absorber, it has transmittance of less than 95% at a short wavelength of 400 nm, and can prevent device damage, which may occur if excessively high transmittance is exhibited.

Further, according to the invention, a pattern that can be applied for a display device may be formed using the cured film. Namely, the invention provides a method for forming a display device pattern using the positive photosensitive resin composition.

If a positive photosensitive cured film formed using the positive photosensitive resin composition of the invention is exposed to light such as UV, ArF, KrF, and the like using a mask having a predetermined pattern, 1,2-quinonediazide derivatives included in the positive photosensitive resin film may be carboxylated, and the exposed part may become soluble in an alkali developer.

Then, if the exposed part is developed using an alkali developer, among the cured film formed from the positive photosensitive resin, exposed parts may be removed, and a pattern may be formed according to the shape of a mask.

Further, the development may be conducted by dipping, fluctuation immersion, and the like, wherein development time is commonly 20 seconds to 180 seconds.

After the alkali development, by washing the positive photosensitive resin cured film with flowing water for 20 seconds to 120 seconds, followed by drying by compressed air or compressed nitrogen or rotation, moisture on the substrate is removed, and a film on which a pattern is formed may be obtained.

Subsequently, the film on which a pattern is formed is post-baked for thermal curing, and specifically, it is heated using a hot plate, oven, and the like, thus obtaining a cured film on which a satisfactory pattern is formed, having excellent heat resistance, planarization property, and low absorption property.

The post-bake may be generally conducted at a heating temperature selected from 130° C. to 300° C., for 5 to 30 minutes on a hot plate, or for 20 to 90 minutes in an oven.

As such, the cured film formed from the positive photosensitive resin composition of the invention not only has excellent performances such as resolution, planarization, and the like, but also has excellent weatherability, thus enabling securing of excellent panel reliability, and thus, can be appropriately used for an interlayer dielectric, a planarization layer or PDL, and the like in various OLED displays.

In other words, the positive photosensitive resin composition may be used to form a pattern for use in an interlayer dielectric of a TFT-LCD, an interlayer dielectric of OLED, or an interlayer dielectric of O-TFT; a passivation insulation layer of a TFT-LCD, a passivation insulation layer of an OLED, or a passivation insulation layer of an O-TFT; a gate insulation layer of a TFT-LCD, a gate insulation layer of an OLED, or a gate insulation layer of an O-TFT; a planarization layer of a TFT-LCD, a planarization layer of an OLED, or a planarization layer of an O-TFT; or a pixel define layer of an OLED. A display device including the cured film on which a pattern is formed may exhibit an excellent insulation property and heat resistance enabling maintenance of a stable shape even up to about 350° C., exhibit less defects due to moisture, and provide excellent light resistance and weatherability. Further, reliability of the display device may be improved.

Hereinafter, examples will be presented for better understanding of the invention. However, these examples are presented only as illustrations of the invention, and the invention is not limited thereby.

Examples and Comparative Examples

Using reactive silane monomers described in the following Table 1, silane copolymers were synthesized, and the molecular weight of synthesized copolymer is as described in Table 2. Each synthesis will be explained in detail later.

TABLE 1

| Synthesis | Copolymer | Reactive silane monomer | | | | | | | | | Catalyst | Washing |
|---|---|---|---|---|---|---|---|---|---|---|---|---|
| | | PTMS | DPDMS | DMDMS | GPTMS | ECETMS | MTMS | PrTMS | TMOS | TEOS | | |
| 1 | 1-a | 30 | | | | | | 30 | 40 | | Acid | ○ |
| 2 | 2-a | | 20 | | | | 40 | | | 40 | Base | ○ |
| 3 | 3-a | | | 30 | | 40 | | | 30 | | acid | ○ |
| 4 | 4-a | | | | 35 | | 35 | | 30 | | Base | ○ |
| 5 | 5-a | | 30 | | | | | 30 | 40 | | Acid | ○ |
| 6 | 6-a | 50 | | 40 | | | | | | 10 | Acid | ○ |
| 7 | 7-a | 25 | | | 25 | | | | 50 | | Acid | |
| 8 | 8-a | | 30 | 10 | | | | 20 | | 40 | Base | ○ |
| 9 | 9-a | | | 70 | | | 10 | | | 20 | Acid | ○ |
| 10 | 10-a | 20 | | 40 | | | | | 40 | | Acid | ○ |
| 11 | 11-a | | 30 | | 30 | | | 40 | | | Acid | ○ |
| 12 | 12-a | | | 40 | | | 45 | | 15 | | Base | ○ |
| 13 | 13-a | 35 | | | | | 15 | | | 50 | Acid | ○ |
| 14 | 14-a | | 40 | | | | | 15 | 45 | | Acid | ○ |
| 15 | 15-a | 40 | | | | | 10 | | | 50 | Acid | ○ |
| 16 | 16-a | | 25 | | | 35 | | | | 40 | Base | ○ |
| 17 | 17-a | | 80 | | | | | | 20 | | Base | ○ |
| 18 | 18-a | 60 | | | | | | | | 40 | Acid | ○ |
| Comparative Synthesi 1 | 20-a | 95 | | | | | | | | 5 | Base | ○ |
| Comparative Synthesi 2 | 21-a | | | | | | 95 | | | 5 | Acid | ○ |
| Comparative Synthesi 3 | 22-a | | | | 93 | | | 7 | | | Acid | ○ |
| Comparative Synthesi 4 | 23-a | 4 | | | | | | 4 | | 92 | Acid | ○ |
| Comparative Synthesi 5 | 24-a | | 5 | | | 4 | | | 91 | | Acid | ○ |
| Comparative Synthesi 6 | 1-b | 30 | | | | | | 30 | 40 | | Acid | X |
| Comparative Synthesi 7 | 6-b | 50 | | 40 | | | | | | 10 | Acid | X |
| Comparative Synthesi 8 | 8-b | | 30 | 10 | | | | 20 | | 40 | Base | X |
| Comparative Synthesi 9 | 11-b | | 30 | | 30 | | | 40 | | | Acid | X |
| Comparative Synthesi 10 | 12-b | | | 40 | | | 45 | | 15 | | Base | X |

Note)
in Table 1,
PTMS: phenyltrimethoxysilane
DPDMS: diphenyldimethoxysilane
DMDMS: dimethyldimethoxysilane
GPTMS: 3-glycidoxypropyl trimethoxysilane
ECETMS: 2-(3-4-epoxycyclohexyl)ethyltrimethoxysilane
MTMS: methyltrimethoxysilane
PrTMS: propyltrimethoxysilane
TMOS: tetramethoxysilane
TEOS: tetraethoxysilane

TABLE 2

| Synthesis | Copolymer | Mw (g/mol) |
|---|---|---|
| 1 | 1-a | 6500 |
| 2 | 2-a | 12,000 |
| 3 | 3-a | 13,500 |
| 4 | 4-a | 8300 |
| 5 | 5-a | 5500 |
| 6 | 6-a | 3100 |
| 7 | 7-a | 17,500 |
| 8 | 8-a | 7800 |
| 9 | 9-2 | 4800 |
| 10 | 10-a | 11,000 |
| 11 | 11-a | 3500 |
| 12 | 12-a | 9200 |
| 13 | 13-a | 22,000 |
| 14 | 14-a | 19,000 |
| 15 | 15-a | 25,000 |
| 16 | 16-a | 18,900 |
| 17 | 17-a | 5400 |
| 18 | 18-a | 8700 |
| Comparative Synthesis 1 | 20-a | 1900 |
| Comparative Synthesis 2 | 21-a | 980 |
| Comparative Synthesis 3 | 22-a | 38,000 |
| Comparative Synthesis 4 | 23-a | 8,800 |
| Comparative Synthesis 5 | 24-a | 31,000 |
| Comparative Synthesis 6 | 1-b | 6800 |
| Comparative Synthesis 7 | 6-b | 2900 |
| Comparative Synthesis 8 | 8-b | 7600 |
| Comparative Synthesis 9 | 11-b | 3800 |
| Comparative Synthesis 10 | 12-b | 9700 |

[Synthesis Example 1]: Preparation of Siloxane-Based Copolymer (1-a)

In a 2 L 3-neck flask equipped with a thermometer, a cooling tube, and a stirrer, 30 parts by weight of phenyltrimethoxysilane, 30 parts by weight of propyltrimethoxysilane, and 40 parts by weight of tetramethoxysilane were introduced as reactive silane, and gently stirred at room temperature for 1 hour under a nitrogen atmosphere. The reaction solution was cooled to 10° C., and 30 parts by weight of a 5% acetic acid aqueous solution were added dropwise, and then the temperature was raised to 60° C. at 5° C./min, and while maintaining the temperature, condensation polymerization was conducted for 12 hours, followed by cooling to room temperature, thus finishing the reaction. Then, catalysts and unreacted monomers were removed through washing and extraction. Further, 30 parts by weight of PGMEA were put therein and decompression distilled to prepare siloxane-based copolymer (1-a) having a solid content of 40%. The weight average molecular weight of the siloxane-based copolymer was 6500 (g/mol). Herein, the weight average molecular weight was a polystyrene-converted weight average molecular weight measured by GPC, and the weight average molecular weight was measured using a standard analysis method of a gel permeation chromatography (GPC) system using a Waters Corp. e2695 Alliance Separation Module.

[Synthesis Example 2]: Preparation of Siloxane-Based Copolymer (2-a)

In a 2 L 3-neck flask equipped with a thermometer, a cooling tube, and a stirrer, 20 parts by weight of diphenyldimethoxysilane, 40 parts by weight of methyltrimethoxysilane, and 40 parts by weight of tetraethoxysilane were introduced as reactive silane, and gently stirred at room temperature for 1 hour under a nitrogen atmosphere. The reaction solution was cooled to 10° C., and 30 parts by weight of a 5% ammonia aqueous solution were added dropwise, and then the temperature was raised to 60° C. at 5° C./min, and while maintaining the temperature, condensation polymerization was conducted for 12 hours, followed by cooling to room temperature, thus finishing the reaction. Then, catalysts and unreacted monomers were removed through washing and extraction. Further, 30 parts by weight of PGMEA were put therein and decompression distilled to prepare siloxane-based copolymer (2-a) having a solid content of 40%. The weight average molecular weight of the siloxane-based copolymer was 12,000 (g/mol). Herein, the weight average molecular weight was a polystyrene-converted weight average molecular weight measured by GPC.

[Synthesis Example 3]: Preparation of Siloxane-Based Copolymer (3-a)

In a 2 L 3-neck flask equipped with a thermometer, a cooling tube, and a stirrer, 30 parts by weight of dimethyldimethoxysilane, 40 parts by weight of 2-(3,4-epoxycyclohexyl)ethyltrimethoxysilane, and 30 parts by weight of tetramethoxysilane were introduced as reactive silane, and gently stirred at room temperature for 1 hour under a nitrogen atmosphere. The reaction solution was cooled to 10° C. and 30 parts by weight of a 5% acetic acid aqueous solution was added dropwise, and then the temperature was raised to 60° C. at 5° C./min, and while maintaining the temperature, condensation polymerization was conducted for 12 hours, followed by cooling to room temperature, thus finishing the reaction. Then, catalysts and unreacted monomers were removed through washing and extraction. Further, 30 parts by weight of PGMEA were put therein and decompression distilled to prepare siloxane-based copolymer (3-a) having a solid content of 40%. The weight average molecular weight of the siloxane-based copolymer was 13,500 (g/mol). Herein, the weight average molecular weight was polystyrene-converted weight average molecular weight measured by GPC.

[Synthesis Example 4]: Preparation of Siloxane-Based Copolymer (4-a)

In a 2 L 3-neck flask equipped with a thermometer, a cooling tube, and a stirrer, 35 parts by weight of dimethyldimethoxysilane, 35 parts by weight of methyltrimethoxysilane, and 30 parts by weight of tetramethoxysilane were introduced as reactive silane, and gently stirred at room temperature for 1 hour under a nitrogen atmosphere. The reaction solution was cooled to 10° C., and 30 parts by weight of a 5% ammonia aqueous solution were added dropwise, and then the temperature was raised to 60° C. at 5° C./min, and while maintaining the temperature, condensation polymerization was conducted for 12 hours, followed by cooling to room temperature, thus finishing the reaction. Then, catalysts and unreacted monomers were removed through washing and extraction. Further, 30 parts by weight of PGMEA were put therein and decompression distilled to prepare siloxane-based copolymer (4-a) having a solid content of 40%. The weight average molecular weight of the siloxane-based copolymer was 8300 (g/mol). Herein, the weight average molecular weight was a polystyrene-converted weight average molecular weight measured by GPC.

[Synthesis Example 5]: Preparation of Siloxane-Based Copolymer (5-a)

In a 2 L 3-neck flask equipped with a thermometer, a cooling tube, and a stirrer, 30 parts by weight of diphenyldimethoxysilane, 30 parts by weight of propyltrimethoxysilane, and 40 parts by weight of tetramethoxysilane were introduced as reactive silane, and gently stirred at room temperature for 1 hour under a nitrogen atmosphere. The reaction solution was cooled to 10° C., and 30 parts by weight of a 5% acetic acid aqueous solution were added dropwise, and then the temperature was raised to 60° C. at 5° C./min, and while maintaining the temperature, condensation polymerization was conducted for 12 hours, followed by cooling to room temperature, thus finishing the reaction. Then, catalysts and unreacted monomers were removed through washing and extraction. Further, 30 parts by weight of PGMEA were put therein and decompression distilled to prepare siloxane-based copolymer (5-a) having a solid content of 40%. The weight average molecular weight of the siloxane-based copolymer was 5500 (g/mol). Herein, the weight average molecular weight was a polystyrene-converted weight average molecular weight measured by GPC.

[Synthesis Example 6]: Preparation of Siloxane-Based Copolymer (6-a)

In a 2 L 3-neck flask equipped with a thermometer, a cooling tube, and a stirrer, 50 parts by weight of phenyltrimethoxysilane, 40 parts by weight of dimethyldimethoxysilane, and 10 parts by weight of tetraethoxysilane were introduced as reactive silane, and gently stirred at room temperature for 1 hour under a nitrogen atmosphere. The reaction solution was cooled to 10° C., and 30 parts by weight of a 5% acetic acid aqueous solution were added dropwise, and then the temperature was raised to 60° C. at 5° C./min, and while maintaining the temperature, condensation polymerization was conducted for 12 hours, followed by cooling to room temperature, thus finishing the reaction. Then, catalysts and unreacted monomers were removed through washing and extraction. Further, 30 parts by weight of PGMEA were put therein and decompression distilled to prepare siloxane-based copolymer (6-a) having a solid content of 40%. The weight average molecular weight of the siloxane-based copolymer was 3100 (g/mol). Herein, the weight average molecular weight was a polystyrene-converted weight average molecular weight measured by GPC.

[Synthesis Example 7]: Preparation of Siloxane-Based Copolymer (7-a)

In a 2 L 3-neck flask equipped with a thermometer, a cooling tube, and a stirrer, 25 parts by weight of phenyltrimethoxysilane, 25 parts by weight of 3-glycidoxypropyltrimethoxysilane, and 50 parts by weight of tetramethoxysilane were introduced as reactive silane, and gently stirred at room temperature for 1 hour under a nitrogen atmosphere. The reaction solution was cooled to 10° C., and 30 parts by weight of a 5% acetic acid aqueous solution were added dropwise, and then the temperature was raised to 60° C. at 5° C./min, and while maintaining the temperature, condensation polymerization was conducted for 12 hours, followed by cooling to room temperature, thus finishing the reaction. Then, catalysts and unreacted monomers were removed through washing and extraction. Further, 30 parts by weight of PGMEA were put therein and decompression distilled to prepare siloxane-based copolymer (7-a) having a solid content of 40%. The weight average molecular weight of the siloxane-based copolymer was 17,500 (g/mol). Herein, the weight average molecular weight was a polystyrene-converted weight average molecular weight measured by GPC.

[Synthesis Example 8]: Preparation of Siloxane-Based Copolymer (8-a)

In a 2 L 3-neck flask equipped with a thermometer, a cooling tube, and a stirrer, 30 parts by weight of diphenyldimethoxysilane, 10 parts by weight of dimethyldimethoxysilane, 20 parts by weight of propyltrimethoxysilane, and 40 parts by weight of tetraethoxysilane were introduced as reactive silane, and gently stirred at room temperature for 1 hour under a nitrogen atmosphere. The reaction solution was cooled to 10° C., and 30 parts by weight of a 5% ammonia aqueous solution were added dropwise, and then the temperature was raised to 60° C. at 5° C./min, and while maintaining the temperature, condensation polymerization was conducted for 12 hours, followed by cooling to room temperature, thus finishing the reaction. Then, catalysts and unreacted monomers were removed through washing and extraction. Further, 30 parts by weight of PGMEA were put therein and decompression distilled to prepare siloxane-based copolymer (8-a) having a solid content of 40%. The weight average molecular weight of the siloxane-based copolymer was 7800 (g/mol). Herein, the weight average molecular weight was a polystyrene-converted weight average molecular weight measured by GPC.

[Synthesis Example 9]: Preparation of Siloxane-Based Copolymer (9-a)

In a 2 L 3-neck flask equipped with a thermometer, a cooling tube, and a stirrer, 70 parts by weight of dimethyldimethoxysilane, 10 parts by weight of methyltrimethoxysilane, and 20 parts by weight of tetraethoxysilane were introduced as reactive silane, and gently stirred at room temperature for 1 hour under a nitrogen atmosphere. The reaction solution was cooled to 10° C., and 30 parts by weight of a 5% acetic acid aqueous solution were added dropwise, and then the temperature was raised to 60° C. at 5° C./min, and while maintaining the temperature, condensation polymerization was conducted for 12 hours, followed by cooling to room temperature, thus finishing the reaction. Then, catalysts and unreacted monomers were removed through washing and extraction. Further, 30 parts by weight of PGMEA were put therein and decompression distilled to prepare siloxane-based copolymer (9-a) having a solid content of 40%. The weight average molecular weight of the siloxane-based copolymer was 4800 (g/mol). Herein, the weight average molecular weight was a polystyrene-converted weight average molecular weight measured by GPC.

[Synthesis Example 10]: Preparation of Siloxane-Based Copolymer (10-a)

In a 2 L 3-neck flask equipped with a thermometer, a cooling tube, and a stirrer, 20 parts by weight of phenyltrimethoxysilane, 40 parts by weight of dimethyldimethoxysilane, and 40 parts by weight of tetramethoxysilane were introduced as reactive silane, and gently stirred at room temperature for 1 hour under a nitrogen atmosphere. The reaction solution was cooled to 10° C., and 30 parts by weight of a 5% acetic acid aqueous solution were added dropwise, and then the temperature was raised to 60° C. at 5° C./min, and while maintaining the temperature, condensation polymerization was conducted for 12 hours, followed by cooling to room temperature, thus finishing the reaction. Then, catalysts and unreacted monomers were removed through washing and extraction. Further, 30 parts by weight of PGMEA were put therein and decompression distilled to prepare siloxane-based copolymer (10-a) having a solid content of 40%. The weight average molecular weight of the siloxane-based copolymer was 11,000 (g/mol). Herein, the weight average molecular weight was a polystyrene-converted weight average molecular weight measured by GPC.

[Synthesis Example 11]: Preparation of Siloxane-Based Copolymer (11-a)

In a 2 L 3-neck flask equipped with a thermometer, a cooling tube, and a stirrer, 30 parts by weight of diphenyldimethoxysilane, 30 parts by weight of 3-glycidoxypropyltrimethoxysilane, and 40 parts by weight of tetrapropoxysilane were introduced as reactive silane, and gently stirred at room temperature for 1 hour under a nitrogen atmosphere. The reaction solution was cooled to 10° C., and 30 parts by weight of a 5% acetic acid aqueous solution were added dropwise, and then the temperature was raised to 60° C. at 5° C./min, and while maintaining the temperature, condensation polymerization was conducted for 12 hours, followed by cooling to room temperature, thus finishing the reaction. Then, catalysts and unreacted monomers were removed through washing and extraction. Further, 30 parts by weight of PGMEA were put therein and decompression distilled to prepare siloxane-based copolymer (11-a) having a solid content of 40%. The weight average molecular weight of the siloxane-based copolymer was 3500 (g/mol). Herein, the weight average molecular weight was a polystyrene-converted weight average molecular weight measured by GPC.

[Synthesis Example 12]: Preparation of Siloxane-Based Copolymer (12-a)

In a 2 L 3-neck flask equipped with a thermometer, a cooling tube, and a stirrer, 40 parts by weight of diphenyldimethoxysilane, 45 parts by weight of methyltrimethoxysilane, and 15 parts by weight of tetramethoxysilane were introduced as reactive silane, and gently stirred at room temperature for 1 hour under a nitrogen atmosphere. The reaction solution was cooled to 10° C., and 30 parts by weight of a 5% ammonia aqueous solution were added dropwise, and then the temperature was raised to 60° C. at 5° C./min, and while maintaining the temperature, condensation polymerization was conducted for 12 hours, followed by cooling to room temperature, thus finishing the reaction. Then, catalysts and unreacted monomers were removed through washing and extraction. Further, 30 parts by weight of PGMEA were put therein and decompression distilled to prepare siloxane-based copolymer (12-a) having a solid content of 40%. The weight average molecular weight of the siloxane-based copolymer was 9200 (g/mol). Herein, the weight average molecular weight was a polystyrene-converted weight average molecular weight measured by GPC.

[Synthesis Example 13]: Preparation of Siloxane-Based Copolymer (13-a)

In a 2 L 3-neck flask equipped with a thermometer, a cooling tube, and a stirrer, 35 parts by weight of phenyltrimethoxysilane, 15 parts by weight of methyltrimethoxysilane, and 50 parts by weight of tetraethoxysilane were introduced as reactive silane, and gently stirred at room temperature for 1 hour under a nitrogen atmosphere. The reaction solution was cooled to 10° C., and 30 parts by weight of a 5% acetic acid aqueous solution were added dropwise, and then the temperature was raised to 60° C. at 5° C./min, and while maintaining the temperature, condensation polymerization was conducted for 12 hours, followed by cooling to room temperature, thus finishing the reaction. Then, catalysts and unreacted monomers were removed through washing and extraction. Further, 30 parts by weight of PGMEA were put therein and decompression distilled to prepare siloxane-based copolymer (13-a) having a solid content of 40%. The weight average molecular weight of the siloxane-based copolymer was 22,000 (g/mol). Herein, the weight average molecular weight was a polystyrene-converted weight average molecular weight measured by GPC.

[Synthesis Example 14]: Preparation of Siloxane-Based Copolymer (14-a)

In a 2 L 3-neck flask equipped with a thermometer, a cooling tube, and a stirrer, 40 parts by weight of diphenyldimethoxysilane, 15 parts by weight of propyltrimethoxysilane, and 45 parts by weight of tetramethoxysilane were introduced as reactive silane, and gently stirred at room temperature for 1 hour under a nitrogen atmosphere. The reaction solution was cooled to 10° C., and 30 parts by weight of a 5 wt % acetic acid aqueous solution were added dropwise, and then the temperature was raised to 60° C. at 5° C./min, and while maintaining the temperature, condensation polymerization was conducted for 12 hours, followed by cooling to room temperature, thus finishing the reaction. Then, catalysts and unreacted monomers were removed through washing and extraction. Further, 30 parts by weight of PGMEA were put therein and decompression distilled to prepare siloxane-based copolymer (14-a) having a solid content of 40%. The weight average molecular weight of the siloxane-based copolymer was 19,000 (g/mol). Herein, the weight average molecular weight was a polystyrene-converted weight average molecular weight measured by GPC.

[Synthesis Example 15]: Preparation of Siloxane-Based Copolymer (15-a)

In a 2 L 3-neck flask equipped with a thermometer, a cooling tube, and a stirrer, 40 parts by weight of phenyltrimethoxysilane, 10 parts by weight of propyltrimethoxysilane, and 50 parts by weight of tetraethoxysilane were introduced as reactive silane, and gently stirred at room temperature for 1 hour under a nitrogen atmosphere. The reaction solution was cooled to 10° C., and 30 parts by weight of a 5% acetic acid aqueous solution were added dropwise, and then the temperature was raised to 60° C. at 5° C./min, and while maintaining the temperature, condensation polymerization was conducted for 12 hours, followed by cooling to room temperature, thus finishing the reaction. Then, catalysts and unreacted monomers were removed through washing and extraction. Further, 30 parts by weight of PGMEA were put therein and decompression distilled to prepare siloxane-based copolymer (15-a) having a solid content of 40%. The weight average molecular weight of the siloxane-based copolymer was 25,000 (g/mol). Herein, the weight average molecular weight was a polystyrene-converted weight average molecular weight measured by GPC.

[Synthesis Example 16]: Preparation of Siloxane-Based Copolymer (16-a)

In a 2 L 3-neck flask equipped with a thermometer, a cooling tube, and a stirrer, 25 parts weight of diphenyldimethoxysilane, by 35 parts by weight of 2-(3,4-epoxycyclohexyl)ethyltrimethoxysilane, and 40 parts by weight of tetracthoxysilane were introduced as reactive silane, and gently stirred at room temperature for 1 hour under a nitrogen atmosphere. The reaction solution was cooled to 10° C., and 30 parts by weight of a 5% ammonia aqueous solution were added dropwise, and then the temperature was raised to 60° C. at 5° C./min, and while maintaining the temperature, condensation polymerization was conducted for 12 hours, followed by cooling to room temperature, thus finishing the reaction. Then, catalysts and unreacted monomers were removed through washing and extraction. Further, 30 parts by weight of PGMEA were put therein and decompression distilled to prepare siloxane-based copolymer (16-a) having a solid content of 40%. The weight average molecular weight of the siloxane-based copolymer was 18,900 (g/mol). Herein, the weight average molecular weight was a polystyrene-converted weight average molecular weight measured by GPC.

[Synthesis Example 17]: Preparation of Siloxane-Based Copolymer (17-a)

In a 2 L 3-neck flask equipped with a thermometer, a cooling tube, and a stirrer, 80 parts by weight of diphenyldimethoxysilane and 20 parts by weight of tetramethoxysilane were introduced as reactive silane, and gently stirred at room temperature for 1 hour under a nitrogen atmosphere. The reaction solution was cooled to 10° C., and 30 parts by weight of a 5% ammonia aqueous solution were added dropwise, and then the temperature was raised to 60° C. at 5° C./min, and while maintaining the temperature, condensation polymerization was conducted for 12 hours, followed by cooling to room temperature, thus finishing the reaction. Then, catalysts and unreacted monomers were removed through washing and extraction. Further, 30 parts by weight of PGMEA were put therein and decompression distilled to prepare siloxane-based copolymer (17-a) having a solid content of 40%. The weight average molecular weight of the siloxane-based copolymer was 5400 (g/mol). Herein, the weight average molecular weight was a polystyrene-converted weight average molecular weight measured by GPC.

[Synthesis Example 18]: Preparation of Siloxane-Based Copolymer (18-a)

In a 2 L 3-neck flask equipped with a thermometer, a cooling tube, and a stirrer, 60 parts by weight of phenyltrimethoxysilane and 40 parts by weight of tetraethoxysilane were introduced as reactive silane, and gently stirred at room temperature for 1 hour under a nitrogen atmosphere. The reaction solution was cooled to 10° C., and 30 parts by weight of a 5% acetic acid aqueous solution were added dropwise, and then the temperature was raised to 60° C. at 5° C./min, and while maintaining the temperature, condensation polymerization was conducted for 12 hours, followed by cooling to room temperature, thus finishing the reaction. Then, catalysts and unreacted monomers were removed through washing and extraction. Further, 30 parts by weight of PGMEA were put therein and decompression distilled to prepare siloxane-based copolymer (18-a) having a solid content of 40%. The weight average molecular weight of the siloxane-based copolymer was 8700 (g/mol). Herein, the weight average molecular weight was a polystyrene-converted weight average molecular weight measured by GPC.

[Synthesis Example 19]: Preparation of 1,2-Quinonediazide Compound (A)

1 mole of a phenol compound represented by the following Chemical Formula G and 2 moles of 1,2-naphthoquinonediazide-5-sulfonic acid chloride were reacted to prepare a 1,2-naphthoquinonediazide-5-sulfonic acid ester compound having an esterification degree of 67%.

[Chemical Formula G]

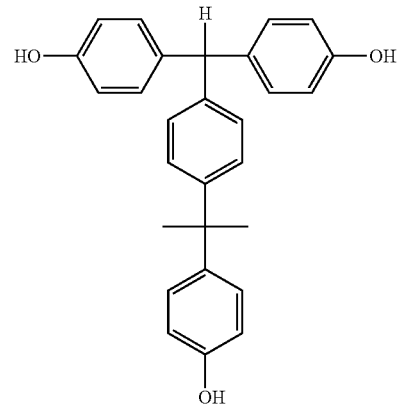

[Comparative Synthesis Example 1]: Preparation of Siloxane-Based Copolymer (20-a)

In a 2 L 3-neck flask equipped with a thermometer, a cooling tube, and a stirrer, 95 parts by weight of phenyltrimethoxysilane and 5 parts by weight of tetraethoxysilane were introduced as reactive silane, and gently stirred at room temperature for 1 hour under a nitrogen atmosphere. The reaction solution was cooled to 10° C., and 30 parts by weight of a 5% ammonia aqueous solution were added dropwise, and then the temperature was raised to 60° C. at 5° C./min, and while maintaining the temperature, condensation polymerization was conducted for 12 hours, followed by cooling to room temperature, thus finishing the reaction. Then, catalysts and unreacted monomers were removed through washing and extraction. Further, 30 parts by weight of PGMEA were put therein and decompression distilled to prepare siloxane-based copolymer (20-a) having a solid content of 40%. The weight average molecular weight of the siloxane-based copolymer was 1900 (g/mol). Herein, the weight average molecular weight was a polystyrene-converted weight average molecular weight measured by GPC.

[Comparative Synthesis Example 2]: Preparation of Siloxane-Based Copolymer (21-a)

In a 2 L 3-neck flask equipped with a thermometer, a cooling tube, and a stirrer, 95 parts by weight of methyltrimethoxysilane and 5 parts by weight of tetramethoxysilane were introduced as reactive silane, and gently stirred at room temperature for 1 hour under a nitrogen atmosphere. The reaction solution was cooled to 10° C., and 30 parts by weight of a 5% acetic acid aqueous solution were added dropwise, and then the temperature was raised to 60° C. at 5° C./min, and while maintaining the temperature, condensation polymerization was conducted for 12 hours, followed by cooling to room temperature, thus finishing the reaction. Then, catalysts and unreacted monomers were removed through washing and extraction. Further, 30 parts by weight of PGMEA were put therein and decompression distilled to prepare siloxane-based copolymer (21-a) having a solid content of 40%. The weight average molecular weight of the siloxane-based copolymer was 980 (g/mol). Herein, the weight average molecular weight was a polystyrene-converted weight average molecular weight measured by GPC.

[Comparative Synthesis Example 3]: Preparation of Siloxane-Based Copolymer (22-a)

In a 2 L 3-neck flask equipped with a thermometer, a cooling tube, and a stirrer, 93 parts by weight of 3-glycidoxypropyltrimethoxysilane and 7 parts by weight of tetrapropoxysilane were introduced as reactive silane, and gently stirred at room temperature for 1 hour under a nitrogen atmosphere. The reaction solution was cooled to 10° C., and 30 parts by weight of a 5% acetic acid aqueous solution were added dropwise, and then the temperature was raised to 60° C. at 5° C./min, and while maintaining the temperature, condensation polymerization was conducted for 12 hours, followed by cooling to room temperature, thus finishing the reaction. Then, catalysts and unreacted monomers were removed through washing and extraction. Further, 30 parts by weight of PGMEA were put therein and decompression distilled to prepare siloxane-based copolymer (22-a) having a solid content of 40%. The weight average molecular weight of the siloxane-based copolymer was 38,000 (g/mol). Herein, the weight average molecular weight was a polystyrene-converted weight average molecular weight measured by GPC.

[Comparative Synthesis Example 4]: Preparation of Siloxane-Based Copolymer (23-a)

In a 2 L 3-neck flask equipped with a thermometer, a cooling tube, and a stirrer, 4 parts by weight of diphenyldimethoxysilane, 4 parts by weight of dimethyldimethoxysilane, and 82 parts by weight of tetramethoxysilane were introduced as reactive silane, and gently stirred at room temperature for 1 hour under a nitrogen atmosphere. The reaction solution was cooled to 10° C., and 30 parts by weight of a 5% acetic acid aqueous solution were added dropwise, and then the temperature was raised to 60° C. at 5° C./min, and while maintaining the temperature, condensation polymerization was conducted for 12 hours, followed by cooling to room temperature, thus finishing the reaction. Then, catalysts and unreacted monomers were removed through washing and extraction. Further, 30 parts by weight of PGMEA were put therein and decompression distilled to prepare siloxane-based copolymer (23-a) having a solid content of 40%. The weight average molecular weight of the siloxane-based copolymer was 8800 (g/mol). Herein, the weight average molecular weight was a polystyrene-converted weight average molecular weight measured by GPC.

[Comparative Synthesis Example 5]: Preparation of Siloxane-Based Copolymer (24-a)

In a 2 L 3-neck flask equipped with a thermometer, a cooling tube, and a stirrer, 5 parts by weight of diphenyldimethoxysilane, 4 parts by weight of 2-(3,4-epoxycyclohexyl)ethyltrimethoxysilane, and 91 parts by weight of tetramethoxysilane were introduced as reactive silane, and gently stirred at room temperature for 1 hour under a nitrogen atmosphere. The reaction solution was cooled to 10° C., and 30 parts by weight of a 5% acetic acid aqueous solution were added dropwise, and then the temperature was raised to 60° C. at 5° C./min, and while maintaining the temperature, condensation polymerization was conducted for 12 hours, followed by cooling to room temperature, thus finishing the reaction. Then, catalysts and unreacted monomers were removed through washing and extraction. Further, 30 parts by weight of PGMEA were put therein and decompression distilled to prepare siloxane-based copolymer (24-a) having a solid content of 40%. The weight average molecular weight of the siloxane-based copolymer was 31,000 (g/mol). Herein, the weight average molecular weight was a polystyrene-converted weight average molecular weight measured by GPC.

[Reference Synthesis Example 1]: Preparation of Siloxane-Based Copolymer (1-b)

The same procedure as Synthesis Example 1 was conducted, except for the process of removing catalysts and unreacted monomers through washing and extraction in Synthesis Example 1. The weight average molecular weight of the siloxane-based copolymer was 6800 (g/mol). Herein, the weight average molecular weight was a polystyrene-converted weight average molecular weight measured by GPC.

[Reference Synthesis Example 2]: Preparation of Siloxane-Based Copolymer (6-b)

The same procedure as Synthesis Example 6 was conducted, except for the process of removing catalysts and unreacted monomers through washing and extraction in Synthesis Example 6. The weight average molecular weight of the siloxane-based copolymer was 2900 (g/mol). Herein, the weight average molecular weight was a polystyrene-converted weight average molecular weight measured by GPC.

[Reference Synthesis Example 3]: Preparation of Siloxane-Based Copolymer (8-b)

The same procedure as Synthesis Example 8 was conducted, except for the process of removing catalysts and unreacted monomers through washing and extraction in Synthesis Example 8. The weight average molecular weight of the siloxane-based copolymer was 7600 (g/mol). Herein, the weight average molecular weight was a polystyrene-converted weight average molecular weight measured by GPC.

[Reference Synthesis Example 4]: Preparation of Siloxane-Based Copolymer (11-b)

The same procedure as Synthesis Example 11 was conducted, except for the process of removing catalysts and unreacted monomers through washing and extraction in Synthesis Example 11. The weight average molecular weight of the siloxane-based copolymer was 3800 (g/mol). Herein, the weight average molecular weight was a polystyrene-converted weight average molecular weight measured by GPC.

[Reference Synthesis Example 5]: Preparation of Siloxane-Based Copolymer (12-b)

The same procedure as Synthesis Example 12 was conducted, except for the process of removing catalysts and unreacted monomers through washing and extraction in Synthesis Example 12. The weight average molecular weight of the siloxane-based copolymer was 9700 (g/mol).

Herein, the weight average molecular weight was a polystyrene-converted weight average molecular weight measured by GPC.

[Uv Absorber]

UV absorbers used in the following examples, comparative examples, and reference examples are as follows.

[Chemical Formula 4]

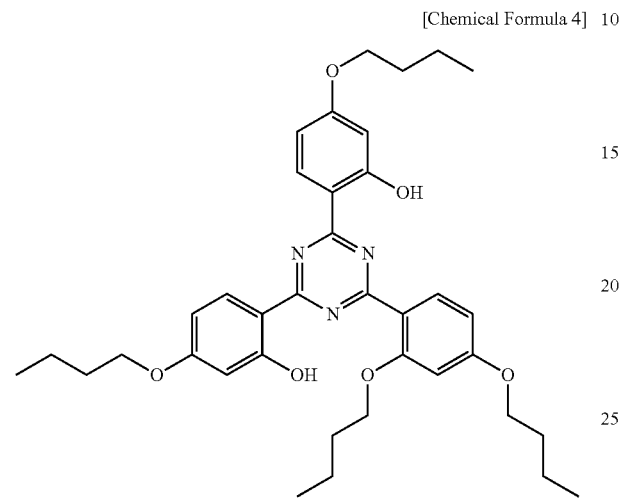

Chemical Formula 4 has a structure of Chemical Formula 1 wherein $R_1$ is propyl, $R_2$, $R_3$, and $R_4$ are each independently butoxy, and $R_5$ is hydroxyl, and has a maximum absorption wavelength at 350 nm.

[Chemical Formula 5]

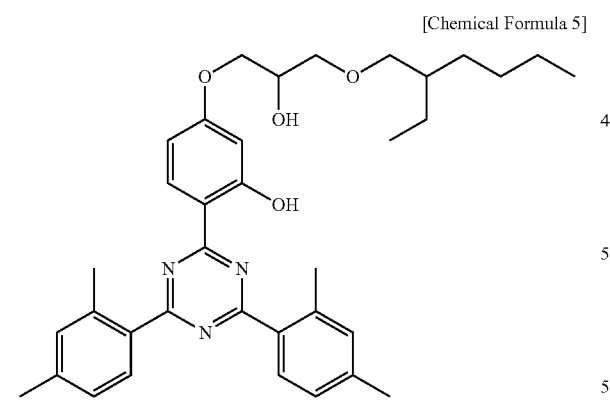

Chemical Formula 5 has a structure of Chemical Formula 1 wherein $R_1$ is 4-[3-(2-ethylhexyl-1-oxy)-2-hydroxypropyl], and $R_2$, $R_3$, $R_4$, and $R_5$ are each independently methyl, and has a maximum absorption wavelength at 295 nm.

[Chemical Formula 6]

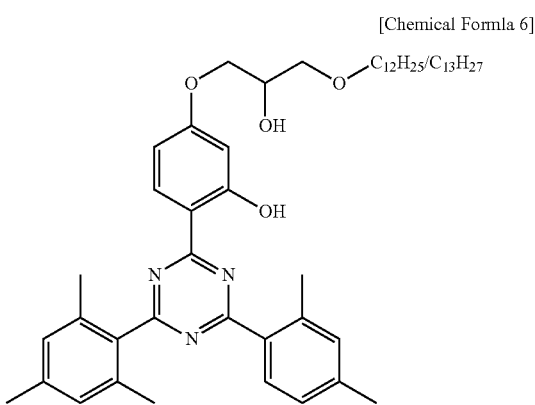

Chemical Formula 6 includes the structure of Chemical Formula 1 wherein $R_1$ is 4-[2-hydroxy-3-tridecyloxypropyl] and 4-[2-hydroxy-3-dodecyloxypropyl], has a structure wherein $R_2$, $R_3$, $R_4$, and $R_5$ are each independently methyl, and has a maximum absorption wavelength at 295 nm.

Chemical Formula 6 consists of a mixture of the following Chemical Formulas 6-1 and 6-2, and in the following examples, comparative examples, and reference examples, TINUVIN400 (product name) corresponding to Chemical Formula 6 was used.

[Chemical Formula 6-1]

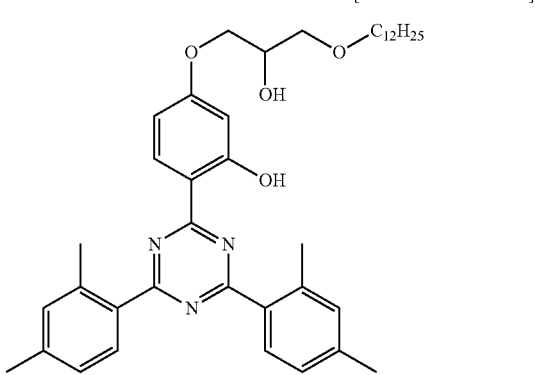

[Chemical Formula 6-2]

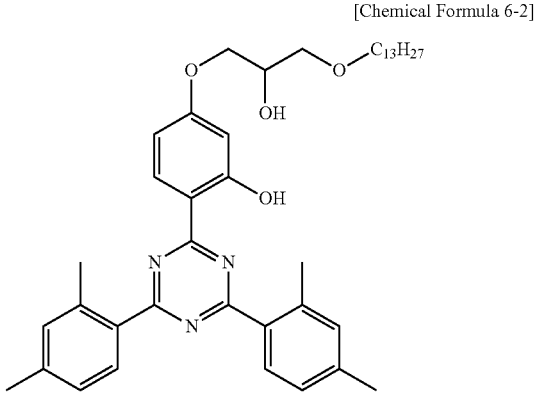

[Chemical Formula 7]

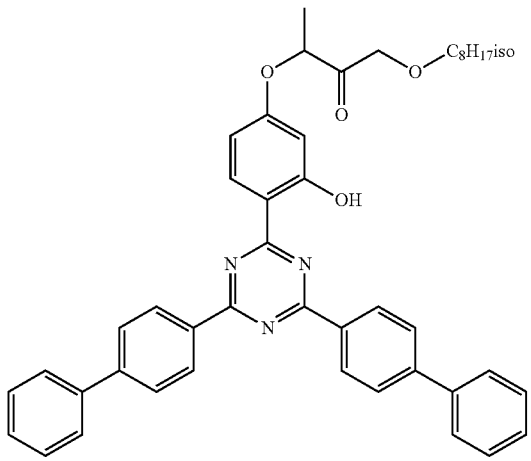

Chemical Formula 7 has a structure of Chemical Formula 1 wherein $R_1$ is isooctylpropanoate, $R_2$ and $R_3$ are each independently hydrogen, and $R_4$ and $R_5$ are each independently phenyl, and has a maximum absorption wavelength at 322 nm.

[Chemical Formula 8]

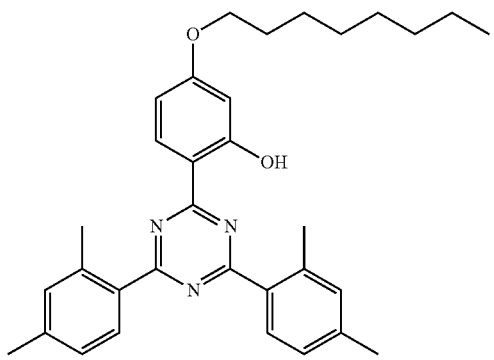

Chemical Formula 8 has a structure of Chemical Formula 1 wherein $R_1$ is octyl, and $R_2$, $R_3$, $R_4$, and $R_5$ are each independently methyl, and has a maximum absorption wavelength at 287 nm.

[Chemical Formula 9]

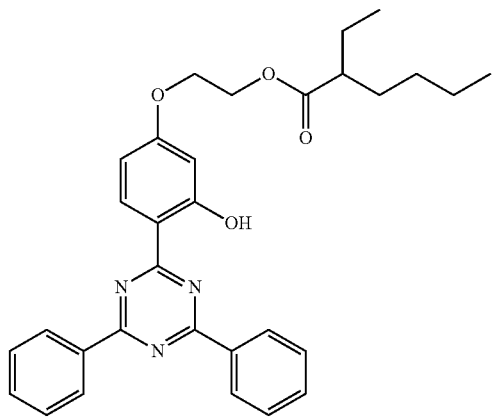

Chemical Formula 9 has a structure of Chemical Formula 1 wherein $R_1$ is 2-(2-ethylhexanoyloxy)ethyl, and $R_2$, $R_3$, $R_4$, and $R_5$ are each independently hydrogen, and has a maximum absorption wavelength at 287 nm.

[Chemical Formula 10]

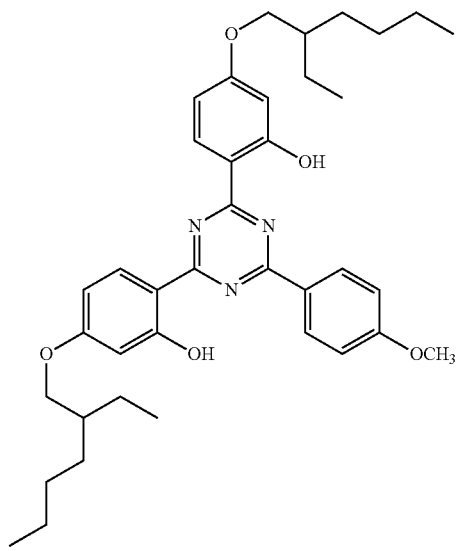

Chemical Formula 10 has a structure of Chemical Formula 1 wherein $R_1$ is 2-ethylhexyl $R_2$ is hydrogen, $R_3$ is methoxy, Ra is 2-ethylhexyloxy, and $R_5$ is hydroxyl, and has a maximum absorption wavelength at 340 nm.

[Chemical Formula 11]

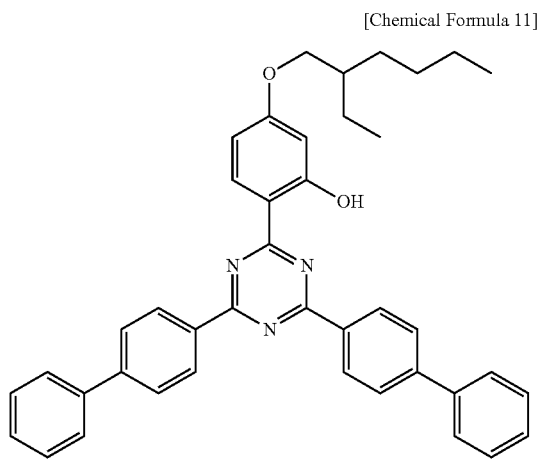 [SMILES: CCCCC(CC)COc1ccc(-c2nc(-c3ccc(-c4ccccc4)cc3)nc(-c3ccc(-c4ccccc4)cc3)n2)c(O)c1]

Chemical Formula 11 has a structure of Chemical Formula 1 wherein $R_1$ is 2-ethylhexyl, $R_2$ and $R_3$ are each independently hydrogen, and $R_4$ and $R_5$ are each independently phenyl, and has a maximum absorption wavelength at 370 nm.

[Chemical Formula 12]

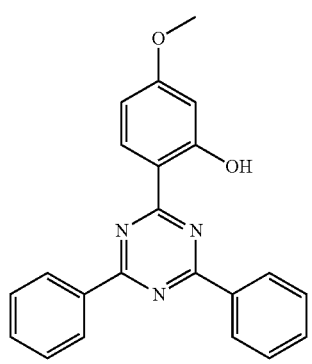

Chemical Formula 12 has a structure of Chemical Formula 1 wherein $R_1$ is methyl, and $R_2$, $R_3$, $R_4$, and $R_5$ are each independently hydrogen, and has a maximum absorption wavelength at 290 nm.

[Chemical Formula 13]

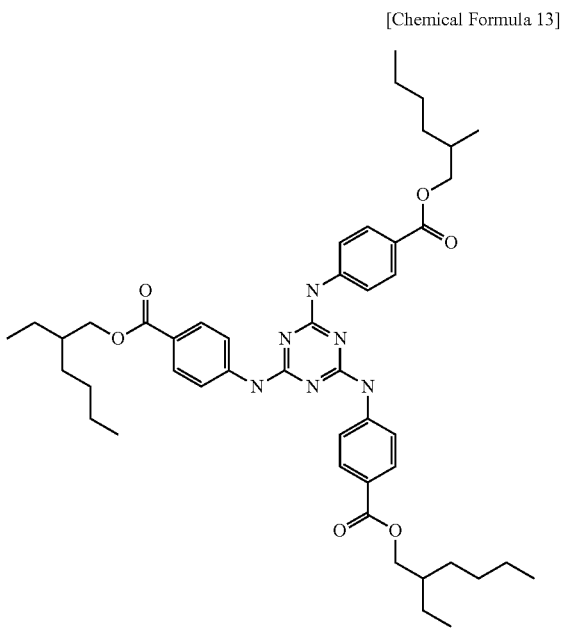 [SMILES: CCCCC(C)COC(=O)c1ccc(Nc2nc(Nc3ccc(C(=O)OCC(CC)CCCC)cc3)nc(Nc3ccc(C(=O)OCC(CC)CCCC)cc3)n2)cc1]

It is the structure of CAS No. 116244-12-3, Uvinul (registered trademark) T150, and has a maximum absorption wavelength at 310 nm.

[Chemical Formula 14]

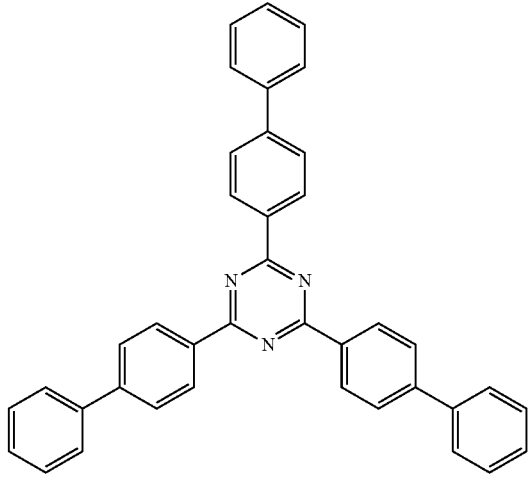

It is the structure of CAS No. 31274-51-8, Tris-biphenyl triazine (TBPT), and has a maximum absorption wavelength at 305 nm.

[Chemical Formula 15]

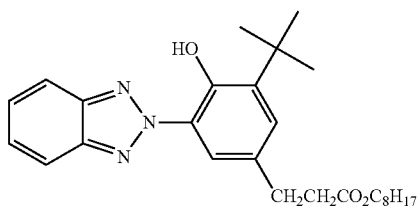

It is the structure of CAS No. 127519-17-9, TINUVIN (registered trademark) 384-2, and has a maximum absorption wavelength at 345 nm.

[Chemical Formula 16]

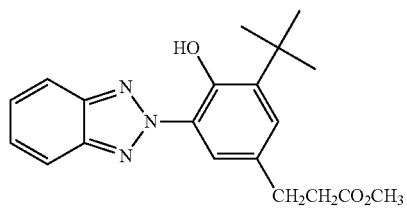

It is the structure of CAS No. 102577-46-8, TINUVIN (registered trademark) 1130, and has a maximum absorption wavelength at 348 nm.

[Chemical Formula 17]

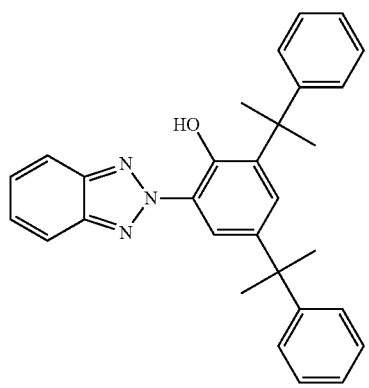

It is the structure of CAS No. 70321-86-7, TINUVIN (registered trademark) 900, and has a maximum absorption wavelength at 348 nm.

Preparation of Positive Photosensitive Resin Composition

Example 1

100 parts by weight of the siloxane-based copolymer (1-a) prepared in Synthesis Example 1 were mixed with 23 parts by weight of the 1,2-naphthoquinonediazide compound (A) prepared in Synthesis Example 19 and 8 parts by weight of [Chemical Formula 4] as a UV absorber, and dissolved in propylene glycol methyl ether acetate such that the solid content of the mixture became 30 parts by weight, and then filtered with a 0.1 μm millipore filter to prepare a positive photosensitive resin composition.

Example 2

A photosensitive resin composition was prepared by the same method as Example 1, except that [Chemical Formula 5] was used instead of [Chemical Formula 4] as a UV absorber in Example 1.

Example 3

A photosensitive resin composition was prepared by the same method as Example 1, except that the siloxane-based copolymer (2-a) of Synthesis Example 2 was used instead of the siloxane-based copolymer (1-a) of Synthesis Example 1, and that [Chemical Formula 6] was used instead of [Chemical Formula 4], in Example 1.

Example 4

A photosensitive resin composition was prepared by the same method as Example 1, except that the siloxane-based copolymer (2-a) of Synthesis Example 2 was used instead of the siloxane-based copolymer (1-a) of Synthesis Example 1, and that [Chemical Formula 8] was used instead of [Chemical Formula 4], in Example 1.

Example 5

A photosensitive resin composition was prepared by the same method as Example 1, except that the siloxane-based copolymer (3-a) of Synthesis Example 3 was used instead of the siloxane-based copolymer (1-a) of Synthesis Example 1, and that [Chemical Formula 10] was used instead of [Chemical Formula 4], in Example 1.

Example 6

A photosensitive resin composition was prepared by the same method as Example 1, except that the siloxane-based copolymer (3-a) of Synthesis Example 3 was used instead of the siloxane-based copolymer (1-a) of Synthesis Example 1, and that [Chemical Formula 12] was used instead of [Chemical Formula 4], in Example 1.

Example 7

A photosensitive resin composition was prepared by the same method as Example 1, except that the siloxane-based copolymer (4-a) of Synthesis Example 4 was used instead of the siloxane-based copolymer (1-a) of Synthesis Example 1, and that [Chemical Formula 9] was used instead of [Chemical Formula 4], in Example 1.

Example 8

A photosensitive resin composition was prepared by the same method as Example 1, except that the siloxane-based copolymer (4-a) of Synthesis Example 4 was used instead of the siloxane-based copolymer (1-a) of Synthesis Example 1, and that [Chemical Formula 11] was used instead of [Chemical Formula 4], in Example 1.

Example 9

A photosensitive resin composition was prepared by the same method as Example 1, except that the siloxane-based copolymer (5-a) of Synthesis Example 5 was used instead of the siloxane-based copolymer (1-a) of Synthesis Example 1, and that [Chemical Formula 7] was used instead of [Chemical Formula 4], in Example 1.

Example 10

A photosensitive resin composition was prepared by the same method as Example 1, except that the siloxane-based copolymer (5-a) of Synthesis Example 5 was used instead of the siloxane-based copolymer (1-a) of Synthesis Example 1 in Example 1.

Example 11

A photosensitive resin composition was prepared by the same method as Example 1, except that the siloxane-based copolymer (6-a) of Synthesis Example 6 was used instead of the siloxane-based copolymer (1-a) of Synthesis Example 1, and that [Chemical Formula 5] was used instead of [Chemical Formula 4], in Example 1.

Example 12

A photosensitive resin composition was prepared by the same method as Example 1, except that the siloxane-based copolymer (6-a) of Synthesis Example 6 was used instead of the siloxane-based copolymer (1-a) of Synthesis Example 1, and that [Chemical Formula 6] was used instead of [Chemical Formula 4], in Example 1.

Example 13

A photosensitive resin composition was prepared by the same method as Example 1, except that the siloxane-based copolymer (7-a) of Synthesis Example 7 was used instead of the siloxane-based copolymer (1-a) of Synthesis Example 1, and that [Chemical Formula 8] was used instead of [Chemical Formula 4], in Example 1.

Example 14

A photosensitive resin composition was prepared by the same method as Example 1, except that the siloxane-based copolymer (7-a) of Synthesis Example 7 was used instead of the siloxane-based copolymer (1-a) of Synthesis Example 1, and that [Chemical Formula 10] was used instead of [Chemical Formula 4], in Example 1.

Example 15

A photosensitive resin composition was prepared by the same method as Example 1, except that the siloxane-based copolymer (8-a) of Synthesis Example 8 was used instead of the siloxane-based copolymer (1-a) of Synthesis Example 1, and that [Chemical Formula 12] was used instead of [Chemical Formula 4], in Example 1.

Example 16

A photosensitive resin composition was prepared by the same method as Example 1, except that the siloxane-based copolymer (8-a) of Synthesis Example 8 was used instead of the siloxane-based copolymer (1-a) of Synthesis Example 1, and that [Chemical Formula 9] was used instead of [Chemical Formula 4], in Example 1.

Example 17

A photosensitive resin composition was prepared by the same method as Example 1, except that the siloxane-based copolymer (9-a) of Synthesis Example 9 was used instead of the siloxane-based copolymer (1-a) of Synthesis Example 1, and that [Chemical Formula 11] was used instead of [Chemical Formula 4], in Example 1.

Example 18

A photosensitive resin composition was prepared by the same method as Example 1, except that the siloxane-based copolymer (9-a) of Synthesis Example 9 was used instead of the siloxane-based copolymer (1-a) of Synthesis Example 1, and that [Chemical Formula 7] was used instead of [Chemical Formula 4], in Example 1.

Example 19

A photosensitive resin composition was prepared by the same method as Example 1, except that the siloxane-based copolymer (10-a) of Synthesis Example 10 was used instead of the siloxane-based copolymer (1-a) of Synthesis Example 1, in Example 1.

Example 20

A photosensitive resin composition was prepared by the same method as Example 1, except that the siloxane-based copolymer (10-a) of Synthesis Example 10 was used instead of the siloxane-based copolymer (1-a) of Synthesis Example 1, and that [Chemical Formula 5] was used instead of [Chemical Formula 4], in Example 1.

Example 21

A photosensitive resin composition was prepared by the same method as Example 1, except that the siloxane-based copolymer (11-a) of Synthesis Example 11 was used instead of the siloxane-based copolymer (1-a) of Synthesis Example 1, and that [Chemical Formula 6] was used instead of [Chemical Formula 4], in Example 1.

Example 22

A photosensitive resin composition was prepared by the same method as Example 1, except that the siloxane-based copolymer (11-a) of Synthesis Example 11 was used instead of the siloxane-based copolymer (1-a) of Synthesis Example 1, and that [Chemical Formula 6] was used instead of [Chemical Formula 4], in Example 1.

Example 23

A photosensitive resin composition was prepared by the same method as Example 1, except that the siloxane-based copolymer (12-a) of Synthesis Example 12 was used instead of the siloxane-based copolymer (1-a) of Synthesis Example 1, and that [Chemical Formula 10] was used instead of [Chemical Formula 4], in Example 1.

Example 24

A photosensitive resin composition was prepared by the same method as Example 1, except that the siloxane-based copolymer (12-a) of Synthesis Example 12 was used instead of the siloxane-based copolymer (1-a) of Synthesis Example 1, and that [Chemical Formula 12] was used instead of [Chemical Formula 4], in Example 1.

Example 25

A photosensitive resin composition was prepared by the same method as Example 1, except that the siloxane-based copolymer (13-a) of Synthesis Example 13 was used instead of the siloxane-based copolymer (1-a) of Synthesis Example 1, and that [Chemical Formula 9] was used instead of [Chemical Formula 4], in Example 1.

Example 26

A photosensitive resin composition was prepared by the same method as Example 1, except that the siloxane-based copolymer (13-a) of Synthesis Example 13 was used instead of the siloxane-based copolymer (1-a) of Synthesis Example 1, and that [Chemical Formula 11] was used instead of [Chemical Formula 4], in Example 1.

Example 27

A photosensitive resin composition was prepared by the same method as Example 1, except that the siloxane-based copolymer (14-a) of Synthesis Example 14 was used instead of the siloxane-based copolymer (1-a) of Synthesis Example 1, and that [Chemical Formula 7] was used instead of [Chemical Formula 4], in Example 1.

Example 28

A photosensitive resin composition was prepared by the same method as Example 1, except that the siloxane-based copolymer (14-a) of Synthesis Example 14 was used instead of the siloxane-based copolymer (1-a) of Synthesis Example 1, in Example 1.

Example 29

A photosensitive resin composition was prepared by the same method as Example 1, except that the siloxane-based copolymer (15-a) of Synthesis Example 15 was used instead of the siloxane-based copolymer (1-a) of Synthesis Example 1, and that [Chemical Formula 5] was used instead of [Chemical Formula 4], in Example 1.

Example 30

A photosensitive resin composition was prepared by the same method as Example 1, except that the siloxane-based copolymer (15-a) of Synthesis Example 15 was used instead of the siloxane-based copolymer (1-a) of Synthesis Example 1, and that [Chemical Formula 6] was used instead of [Chemical Formula 4], in Example 1.

Example 31

A photosensitive resin composition was prepar16d by the same method as Example 1, except that the siloxane-based copolymer (16-a) of Synthesis Example 16 was used instead of the siloxane-based copolymer (1-a) of Synthesis Example 1, and that [Chemical Formula 8] was used instead of [Chemical Formula 4], in Example 1.

Example 32

A photosensitive resin composition was prepared by the same method as Example 1, except that the siloxane-based copolymer (16-a) of Synthesis Example 16 was used instead of the siloxane-based copolymer (1-a) of Synthesis Example 1, and that [Chemical Formula 10] was used instead of [Chemical Formula 4], in Example 1.

Example 33

A photosensitive resin composition was prepared by the same method as Example 1, except that the siloxane-based copolymer (17-a) of Synthesis Example 17 was used instead of the siloxane-based copolymer (1-a) of Synthesis Example 1, and that [Chemical Formula 12] was used instead of [Chemical Formula 4], in Example 1.

Example 34

A photosensitive resin composition was prepared by the same method as Example 1, except that the siloxane-based copolymer (17-a) of Synthesis Example 17 was used instead of the siloxane-based copolymer (1-a) of Synthesis Example 1, and that [Chemical Formula 9] was used instead of [Chemical Formula 4], in Example 1.

Example 35

A photosensitive resin composition was prepared by the same method as Example 1, except that the siloxane-based copolymer (18-a) of Synthesis Example 18 was used instead of the siloxane-based copolymer (1-a) of Synthesis Example 1, and that [Chemical Formula 11] was used instead of [Chemical Formula 4], in Example 1.

Example 36

A photosensitive resin composition was prepared by the same method as Example 1, except that the siloxane-based copolymer (18-a) of Synthesis Example 18 was used instead of the siloxane-based copolymer (1-a) of Synthesis Example 1, and that [Chemical Formula 7] was used instead of [Chemical Formula 4], in Example 1.

Example 37

A photosensitive resin composition was prepared by the same method as Example 1, except that the siloxane-based copolymer (2-a) of Synthesis Example 2 was used instead of the siloxane-based copolymer (1-a) of Synthesis Example 1, and that 4 parts by weight of [Chemical Formula 6] and 4 parts by weight of [Chemical Formula 12] were used instead of 8 parts by weight of [Chemical Formula 4], in Example 1.

Example 38

A photosensitive resin composition was prepared by the same method as Example 1, except that the siloxane-based copolymer (2-a) of Synthesis Example 2 was used instead of the siloxane-based copolymer (1-a) of Synthesis Example 1, and that 4 parts by weight of [Chemical Formula 8] and 4 parts by weight of [Chemical Formula 9] were used in combination instead of 8 parts by weight of [Chemical Formula 4], in Example 1.

Example 39

A photosensitive resin composition was prepared by the same method as Example 1, except that the siloxane-based copolymer (3-a) of Synthesis Example 3 was used instead of the siloxane-based copolymer (1-a) of Synthesis Example 1, and that 6 parts by weight of [Chemical Formula 10] and 2 parts by weight of [Chemical Formula 12] were used in combination instead of 8 parts by weight of [Chemical Formula 4], in Example 1.

Example 40

A photosensitive resin composition was prepared by the same method as Example 1, except that the siloxane-based copolymer (3-a) of Synthesis Example 3 was used instead of the siloxane-based copolymer (1-a) of Synthesis Example 1, and that 6 parts by weight of [Chemical Formula 9] and 2 parts by weight of [Chemical Formula 11] were used in combination instead of 8 parts by weight of [Chemical Formula 4], in Example 1.

Example 41

A photosensitive resin composition was prepared by the same method as Example 1, except that the siloxane-based copolymer (4-a) of Synthesis Example 4 was used instead of the siloxane-based copolymer (1-a) of Synthesis Example 1, and that 2 parts by weight of [Chemical Formula 4] and 6 parts by weight of [Chemical Formula 7] were used in combination instead of 8 parts by weight of [Chemical Formula 4], in Example 1.

Example 42

A photosensitive resin composition was prepared by the same method as Example 1, except that the siloxane-based copolymer (4-a) of Synthesis Example 4 was used instead of the siloxane-based copolymer (1-a) of Synthesis Example 1, and that 6 parts by weight of [Chemical Formula 5] and 2 parts by weight of [Chemical Formula 10] were used in combination instead of 8 parts by weight of [Chemical Formula 4], in Example 1.

Example 43

A photosensitive resin composition was prepared by the same method as Example 1, except that 0.5 parts by weight of [Chemical Formula 4] were used instead of 8 parts by weight.

Example 44

A photosensitive resin composition was prepared by the same method as Example 1, except that 8 parts by weight of the 1,2-naphthoquinonediazide compound (A) prepared in Synthesis Example 19 were used instead of 23 parts by weight, and that 8 parts by weight of [Chemical Formula 12] were used instead of 8 parts by weight of [Chemical Formula 4], in Example 1.

Example 45

A photosensitive resin composition was prepared by the same method as Example 1, except that 8 parts by weight of the 1,2-naphthoquinonediazide compound (A) prepared in Synthesis Example 19 were used instead of 23 parts by weight, and that 0.5 parts by weight of [Chemical Formula 8] were used instead of 8 parts by weight of [Chemical Formula 4], in Example 1.

Example 46

A photosensitive resin composition was prepared by the same method as Example 1, except that 48 parts by weight of the 1,2-naphthoquinonediazide compound (A) prepared in Synthesis Example 19 were used instead of 23 parts by weight, and that 8 parts by weight of [Chemical Formula 9] were used instead of 8 parts by weight of [Chemical Formula 4], in Example 1.

Example 47

A photosensitive resin composition was prepared by the same method as Example 1, except that 48 parts by weight of the 1,2-naphthoquinonediazide compound (A) prepared in Synthesis Example 19 were used instead of 23 parts by weight, and that 0.5 parts by weight of [Chemical Formula 6] were used instead of 8 parts by weight of [Chemical Formula 4], in Example 1.

Comparative Examples

1) Preparation of Siloxane Copolymer in which the UV Absorber of the Invention is not Used In order to compare the properties in case the UV absorber of the invention is not used, photosensitive resin compositions of Comparative Examples 1 to 11 were prepared.

Comparative Example 1

A photosensitive resin composition was prepared by the same method as Example 1, except that [Chemical Formula 13] was used instead of [Chemical Formula 4] in Example 1.

Comparative Example 2

A photosensitive resin composition was prepared by the same method as Example 1, except that [Chemical Formula 14] was used instead of [Chemical Formula 4] in Example 1.

Comparative Example 3

A photosensitive resin composition was prepared by the same method as Example 1, except that [Chemical Formula 16] was used instead of [Chemical Formula 4] in Example 1.

Comparative Example 4

A photosensitive resin composition was prepared by the same method as Example 1, except that [Chemical Formula 17] was used instead of [Chemical Formula 4] in Example 1.

Comparative Example 5

A photosensitive resin composition was prepared by the same method as Example 1, except that [Chemical Formula 15] was used instead of [Chemical Formula 4] in Example 1.

Comparative Example 6

A photosensitive resin composition was prepared by the same method as Example 1, except that the siloxane-based copolymer (5-a) of Synthesis Example 5 was used instead of the siloxane-based copolymer (1-a) of Synthesis Example 1,

Comparative Example 7

A photosensitive resin composition was prepared by the same method as Example 1, except that the siloxane-based copolymer (5-a) of Synthesis Example 5 was used instead of the siloxane-based copolymer (1-a) of Synthesis Example 1, and that [Chemical Formula 14] was used instead of [Chemical Formula 4], in Example 1.

Comparative Example 8

A photosensitive resin composition was prepared by the same method as Example 1, except that the siloxane-based copolymer (5-a) of Synthesis Example 5 was used instead of the siloxane-based copolymer (1-a) of Synthesis Example 1, and that [Chemical Formula 16] was used instead of [Chemical Formula 4], in Example 1.

Comparative Example 9

A photosensitive resin composition was prepared by the same method as Example 1, except that the siloxane-based copolymer (5-a) of Synthesis Example 5 was used instead of the siloxane-based copolymer (1-a) of Synthesis Example 1, and that [Chemical Formula 17] was used instead of [Chemical Formula 4], in Example 1.

Comparative Example 10

A photosensitive resin composition was prepared by the same method as Example 1, except that the siloxane-based copolymer (5-a) of Synthesis Example 5 was used instead of the siloxane-based copolymer (1-a) of Synthesis Example 1, and that [Chemical Formula 15] was used instead of [Chemical Formula 4], in Example 1.

Comparative Example 11

A photosensitive resin composition was prepared by the same method as Example 1, except that the UV absorber was not used in Example 1.

2) Preparation of Siloxane Copolymer in which the Content of Quinonediazide and the Kind of UV Absorber are Changed In order to compare properties in case the content of quinonediazide is different, and the UV absorber of the invention is not used, or a different kind of UV absorber is used, unlike Example 1 of the invention, photosensitive resin compositions of Comparative Examples 12 to 18 were prepared.

Comparative Example 12

A photosensitive resin composition was prepared by the same method as Example 1, except that 54 parts by weight of the 1,2-naphthoquinonediazide compound (A) prepared in Synthesis Example 19 were used instead of 23 parts by weight, and that a UV absorber was not used.

Comparative Example 13

A photosensitive resin composition was prepared by the same method as Example 1, except that 3 parts by weight of the 1,2-naphthoquinonediazide compound (A) prepared in Synthesis Example 19 were used instead of 23 parts by weight, and that a UV absorber was not used.

Comparative Example 14

A photosensitive resin composition was prepared by the same method as Example 1, except that 54 parts by weight of the 1,2-naphthoquinonediazide compound (A) prepared in Synthesis Example 19 were used instead of 23 parts by weight, and that 4 parts by weight of [Chemical Formula 4] and 4 parts by weight of [Chemical Formula 13] were used instead of 8 parts by weight of [Chemical Formula 4] as a UV absorber, in Example 1.

Comparative Example 15

A photosensitive resin composition was prepared by the same method as Example 1, except that 54 parts by weight of the 1,2-naphthoquinonediazide compound (A) prepared in Synthesis Example 19 were used instead of 23 parts by weight, and that 4 parts by weight of [Chemical Formula 5] and 4 parts by weight of [Chemical Formula 14] were used instead of 8 parts by weight of [Chemical Formula 4] as a UV absorber, in Example 1.

Comparative Example 16

A photosensitive resin composition was prepared by the same method as Example 1, except that 54 parts by weight of the 1,2-naphthoquinonediazide compound (A) prepared in Synthesis Example 19 were used instead of 23 parts by weight, and that 9 parts by weight of [Chemical Formula 10] and 1 part by weight of [Chemical Formula 15] were used instead of 8 parts by weight of [Chemical Formula 4] as a UV absorber, in Example 1.

Comparative Example 17

A photosensitive resin composition was prepared by the same method as Example 1, except that 54 parts by weight of the 1,2-naphthoquinonediazide compound (A) prepared in Synthesis Example 19 were used instead of 23 parts by weight, and that 9 parts by weight of [Chemical Formula 6] and 1 part by weight of [Chemical Formula 17] were used instead of 8 parts by weight of [Chemical Formula 4] as a UV absorber, in Example 1.

Comparative Example 18

A photosensitive resin composition was prepared by the same method as Example 1, except that 54 parts by weight of the 1,2-naphthoquinonediazide compound (A) prepared in Synthesis Example 19 were used instead of 23 parts by weight, and that 9 parts by weight of [Chemical Formula 4] and 1 part by weight of [Chemical Formula 16] were used instead of 8 parts by weight of [Chemical Formula 4] as a UV absorber, in Example 1.

Reference Examples

1) Preparation of Siloxane Copolymer in which Silane Monomers are Changed

In order to compare properties in case the copolymers of Comparative Synthesis Examples 1 to 10 prepared using different reactive silane monomers were used instead of the siloxane copolymer of Synthesis Example 1, photosensitive resin compositions of Reference Examples 1 to 10 were prepared.

Reference Example 1

A photosensitive resin composition was prepared by the same method as Example 1, except that the siloxane-based copolymer (20-a) of Comparative Synthesis Example 1 was used instead of the siloxane-based copolymer (1-a) of Synthesis Example 1.

Reference Example 2

A photosensitive resin composition was prepared by the same method as Example 1, except that the siloxane-based copolymer (21-a) of Comparative Synthesis Example 2 was used instead of the siloxane-based copolymer (1-a) of Synthesis Example 1, and that 8 parts by weight of [Chemical Formula 6] were used instead of 8 parts by weight of [Chemical Formula 4], in Example 1.

Reference Example 3

A photosensitive resin composition was prepared by the same method as Example 1, except that the siloxane-based copolymer (22-a) of Comparative Synthesis Example 3 was used instead of the siloxane-based copolymer (1-a) of Synthesis Example 1, and that 8 parts by weight of [Chemical Formula 10] were used instead of 8 parts by weight of [Chemical Formula 4], in Example 1.

Reference Example 4

A photosensitive resin composition was prepared by the same method as Example 1, except that the siloxane-based copolymer (23-a) of Comparative Synthesis Example 4 was used instead of the siloxane-based copolymer (1-a) of Synthesis Example 1, and that 8 parts by weight of [Chemical Formula 9] were used instead of 8 parts by weight of [Chemical Formula 4], in Example 1.

Reference Example 5

A photosensitive resin composition was prepared by the same method as Example 1, except that the siloxane-based copolymer (24-a) of Comparative Synthesis Example 5 was used instead of the siloxane-based copolymer (1-a) of Synthesis Example 1, and that 8 parts by weight of [Chemical Formula 7] were used instead of 8 parts by weight of [Chemical Formula 4], in Example 1.

Reference Example 6

A photosensitive resin composition was prepared by the same method as Example 1, except that the siloxane-based copolymer (1-b) of Reference Synthesis Example 1 was used instead of the siloxane-based copolymer (1-a) of Synthesis Example 1, and that 8 parts by weight of [Chemical Formula 11] were used instead of 8 parts by weight of [Chemical Formula 4], in Example 1.

Reference Example 7

A photosensitive resin composition was prepared by the same method as Example 1, except that the siloxane-based copolymer (6-b) of Reference Synthesis Example 2 was used instead of the siloxane-based copolymer (1-a) of Synthesis Example 1, and that 8 parts by weight of [Chemical Formula 12] were used instead of 8 parts by weight of [Chemical Formula 4], in Example 1.

Reference Example 8

A photosensitive resin composition was prepared by the same method as Example 1, except that the siloxane-based copolymer (8-b) of Reference Synthesis Example 3 was used instead of the siloxane-based copolymer (1-a) of Synthesis Example 1, and that 8 parts by weight of [Chemical Formula 8] were used instead of 8 parts by weight of [Chemical Formula 4], in Example 1.

Reference Example 9

A photosensitive resin composition was prepared by the same method as Example 1, except that the siloxane-based copolymer (11-b) of Reference Synthesis Example 4 was used instead of the siloxane-based copolymer (1-a) of Synthesis Example 1, and that 8 parts by weight of [Chemical Formula 5] were used instead of 8 parts by weight of [Chemical Formula 4], in Example 1.

Reference Example 10

A photosensitive resin composition was prepared by the same method as Example 1, except that the siloxane-based copolymer (12-b) of Reference Synthesis Example 5 was used instead of the siloxane-based copolymer (1-a) of Synthesis Example 1, and that 4 parts by weight of [Chemical Formula 4] and 4 parts by weight of [Chemical Formula 10] were used instead of 8 parts by weight of [Chemical Formula 4], in Example 1.

2) Preparation of Siloxane Copolymer in which the Contents of Quinonediazide and/or UV Absorber are Changed Unlike Example 1 of the present invention, in order to compare physical properties when the content of quinonediazide and/or the UV absorber is outside the range of the present invention, the photosensitive resin compositions of Reference Examples 11 to 18 were prepared.

Reference Example 11

A photosensitive resin composition was prepared by the same method as Example 1, except that 54 parts by weight of the 1,2-naphthoquinonediazide compound (A) prepared in Synthesis Example 19 were used instead of 23 parts by weight, and that 8 parts by weight of [Chemical Formula 6] were used as a UV absorber, in Example 1.

Reference Example 12

A photosensitive resin composition was prepared by the same method as Example 1, except that 54 parts by weight of the 1,2-naphthoquinonediazide compound (A) prepared in Synthesis Example 19 were used instead of 23 parts by weight, and that 12 parts by weight of [Chemical Formula 7] were used as a UV absorber instead of 8 parts by weight of [Chemical Formula 4].

Reference Example 13

A photosensitive resin composition was prepared by the same method as Example 1, except that 12 parts by weight of [Chemical Formula 6] were used as a UV absorber instead of 8 parts by weight of [Chemical Formula 4], in Example 1.

Reference Example 14

A photosensitive resin composition was prepared by the same method as Example 1, except that 3 parts by weight of the 1,2-naphthoquinonediazide compound (A) prepared in Synthesis Example 19 were used instead of 23 parts by weight, and that 8 parts by weight of [Chemical Formula 10] were used as a UV absorber instead of 8 parts by weight of [Chemical Formula 4], in Example 1.

Reference Example 15

A photosensitive resin composition was prepared by the same method as Example 1, except that 3 parts by weight of the 1,2-naphthoquinonediazide compound (A) prepared in Synthesis Example 19 were used instead of 23 parts by weight, and that 12 parts by weight of [Chemical Formula 12] were used as a UV absorber instead of 8 parts by weight of [Chemical Formula 4].

Reference Example 16

A photosensitive resin composition was prepared by the same method as Example 1, except that 12 parts by weight of [Chemical Formula 9] were used as a UV absorber instead of 8 parts by weight of [Chemical Formula 4].

Reference Example 17

A photosensitive resin composition was prepared by the same method as Example 1, except that 12 parts by weight of [Chemical Formula 7] were used as a UV absorber instead of 8 parts by weight of [Chemical Formula 4].

Reference Example 18

A photosensitive resin composition was prepared by the same method as Example 1, except that 3 parts by weight of the 1,2-naphthoquinonediazide compound (A) prepared in Synthesis Example 19 were used instead of 23 parts by weight, and that 6 parts by weight of [Chemical Formula 4] and 6 parts by weight of [Chemical Formula 11] were used as a UV absorber instead of 8 parts by weight of [Chemical Formula 4].

Experimental Examples

For each example, reference example, and comparative example, sensitivity, resolution, transmittance, and light fastness, cracks, precipitation, whitening, and OLED reliability were measured and are shown in the following Tables 3-9.

1) Sensitivity

On the film formed as explained above, using a predetermined pattern mask, UV having intensity of 20 mW/cm$^2$ at 435 nm was irradiated at a 15 μm line and space 1:1 CD standard dose, and then it was developed with 2.38 wt % of a tetramethylammonium hydroxide aqueous solution at 23° C. for 1 minute, followed by washing with ultrapure water for 1 minute.

Then, it was cured in an oven at 250° C. for 60 minutes to obtain a patterned cured film having a thickness of 3 μm.

B) Resolution

For the patterned cured film formed for measurement of sensitivity in A), a minimum size at which a pattern was normally formed was measured. If the minimum size was less than 3 μm, it was marked as ○, if the minimum size was 3 to less than 5 μm, it was marked as Δ, and if the minimum size was 5 μm or more, it was marked as x.

C) Transmittance and Light Fastness

For the evaluation of transmittance and light fastness, 400 nm transmittance of the patterned cured film formed for measurement of sensitivity in A) was measured using a spectrometer. Further, for measurement of light fastness, 500 J energy was irradiated with a metal halide lamp, and then a rate of transmittance change was measured. If the rate of transmittance change was 10% or more, it was marked as x, if it was 5 to less than 10%, it was marked as Δ, and if it was less than 5%, it was marked as ○.

D) Crack

For the evaluation of cracks, a substrate to be evaluated was visually inspected and observed with a microscope at 100-fold magnification, and if cracks were observed, it was marked as x, if cracks were observed only at the edge of the coating, it was marked as Δ, and if cracks were not observed, it was marked as ○.

E) Precipitation

For the evaluation of precipitation, the positive photosensitive resin composition was coated on a glass substrate using a spin coater, and then pre-baked on a hot plate at 110° C. for 2 minutes to form a film with a thickness of 3.2 μm, and visually inspected and observed with a microscope at 100-fold magnification to detect whether or not precipitation was generated due to insufficient solubility. If precipitation was not generated, it was marked as ○, and if precipitation was generated, it is marked as x.

F) Whitening

For the evaluation of whitening, the positive photosensitive resin composition was coated on a glass substrate using a spin coater, and then pre-baked on a hot plate at 110° C. for 2 minutes to form a film with a thickness of 3.2 μm, and it was measured with a Haze meter, and if the value was 0 to less than 0.5, it was marked as ○, and if it was 0.5 to less than 1, it was marked as Δ, and if it was 1 or more, it was marked as x.

G) OLED Reliability

A patterned film was formed on a patterned ITO substrate as shown in FIG. 1, by the same method as the sensitivity measurement of A), and EL was deposited. On the top, Al was deposited as a cathode, and encapsulation was progressed. Under 85° C., 85% RH, device on state, a time (T97) when luminance dropped by 3% was evaluated. In case more than 1000 hours were secured, it was marked as ○, and in case it is less than 1000 hours, it was marked as x.

Experimental Example 1

Property Comparison According to the Kind of UV Absorber

The properties of Examples 1 to 36, and Comparative Examples 1 to 12 wherein the UV absorber of the invention was not used, were compared, and the results are shown in Tables 3, 4, and 5.

TABLE 3

| | Siloxane copolymer (100 parts by weight) | Quinonediazide | UV absorber | Sensitivity (mJ) | Resolution | Transmittance | Light fastness | Crack | Whitening | OLED Reliability |
|---|---|---|---|---|---|---|---|---|---|---|
| Example 1 | Synthesis Example1 1-a | 23 | [Chemical Formula4] 8 | 70 | ○ | 90 | ○ | ○ | ○ | ○ |
| Example 2 | Synthesis Example1 1-a | 23 | [Chemical Formula5] 8 | 71 | ○ | 91 | ○ | ○ | ○ | ○ |
| Example 3 | Synthesis Example2 2-a | 23 | [Chemical Formula6] 8 | 75 | ○ | 90 | ○ | ○ | ○ | ○ |
| Example 4 | Synthesis Example2 2-a | 23 | [Chemical Formula8] 8 | 74 | ○ | 92 | ○ | ○ | ○ | ○ |
| Example 5 | Synthesis Example3 3-a | 23 | [Chemical Formula10] 8 | 75 | ○ | 90 | ○ | ○ | ○ | ○ |
| Example 6 | Synthesis Example3 3-a | 23 | [Chemical Formula12] 8 | 77 | ○ | 89 | ○ | ○ | ○ | ○ |
| Example 7 | Synthesis Example4 4-a | 23 | [Chemical Formula9] 8 | 71 | ○ | 88 | ○ | ○ | ○ | ○ |
| Example 8 | Synthesis Example4 4-a | 23 | [Chemical Formula11] 8 | 71 | ○ | 88 | ○ | ○ | ○ | ○ |
| Example 9 | Synthesis Example5 5-a | 23 | [Chemical Formula7] 8 | 68 | ○ | 89 | ○ | ○ | ○ | ○ |
| Example 10 | Synthesis Example5 5-a | 23 | [Chemical Formula4] 8 | 70 | ○ | 90 | ○ | ○ | ○ | ○ |
| Example 11 | Synthesis Example6 6-a | 23 | [Chemical Formula5] 8 | 68 | ○ | 90 | ○ | ○ | ○ | ○ |
| Example 12 | Synthesis Example6 6-a | 23 | [Chemical Formula6] 8 | 70 | ○ | 88 | ○ | ○ | ○ | ○ |
| Example 13 | Synthesis Example7 7-a | 23 | [Chemical Formula8] 8 | 75 | ○ | 88 | ○ | ○ | ○ | ○ |
| Example 14 | Synthesis Example7 7-a | 23 | [Chemical Formula10] 8 | 74 | ○ | 89 | ○ | ○ | ○ | ○ |
| Example 15 | Synthesis Example8 8-a | 23 | [Chemical Formula12] 8 | 72 | ○ | 90 | ○ | ○ | ○ | ○ |
| Example 16 | Synthesis Example8 8-a | 23 | [Chemical Formula9] 8 | 70 | ○ | 88 | ○ | ○ | ○ | ○ |
| Example 17 | Synthesis Example9 9-a | 23 | [Chemical Formula11] 8 | 70 | ○ | 90 | ○ | ○ | ○ | ○ |
| Example 18 | Synthesis Example9 9-a | 23 | [Chemical Formula7] 8 | 72 | ○ | 91 | ○ | ○ | ○ | ○ |
| Example 19 | Synthesis Example10 10-a | 23 | [Chemical Formula4] 8 | 72 | ○ | 90 | ○ | ○ | ○ | ○ |
| Example 20 | Synthesis Example10 10-a | 23 | [Chemical Formula5] 8 | 72 | ○ | 92 | ○ | ○ | ○ | ○ |
| Example 21 | Synthesis Example11 11-a | 23 | [Chemical Formula6] 8 | 70 | ○ | 88 | ○ | ○ | ○ | ○ |
| Example 22 | Synthesis Example11 11-a | 23 | [Chemical Formula8] 8 | 70 | ○ | 89 | ○ | ○ | ○ | ○ |

TABLE 4

| | Siloxane copolymer (100 parts by weight) | Quinonediazide | UV absorber | Sensitivity (mJ) | Resolution | Transmittance | Light fastness | Crack | Whitening | OLED Reliability |
|---|---|---|---|---|---|---|---|---|---|---|
| Example 23 | Synthesis Example12 12-a | 23 | [Chemical Formula10] 8 | 72 | ○ | 80 | ○ | ○ | ○ | ○ |
| Example 24 | Synthesis Example12 12-a | 23 | [Chemical Formula12] 8 | 73 | ○ | 91 | ○ | ○ | ○ | ○ |
| Example 25 | Synthesis Example13 13-a | 23 | [Chemical Formula9] 8 | 75 | ○ | 91 | ○ | ○ | ○ | ○ |
| Example 26 | Synthesis Example13 13-a | 23 | [Chemical Formula11] 8 | 77 | ○ | 90 | ○ | ○ | ○ | ○ |
| Example 27 | Synthesis Example14 14-a | 23 | [Chemical Formula7] 8 | 75 | ○ | 88 | ○ | ○ | ○ | ○ |
| Example 28 | Synthesis Example14 14-a | 23 | [Chemical Formula4] 8 | 74 | ○ | 89 | ○ | ○ | ○ | ○ |
| Example 29 | Synthesis Example15 15-a | 23 | [Chemical Formula5] 8 | 77 | ○ | 90 | ○ | ○ | ○ | ○ |
| Example 30 | Synthesis Example15 15-a | 23 | [Chemical Formula6] 8 | 76 | ○ | 92 | ○ | ○ | ○ | ○ |
| Example 31 | Synthesis Example16 16-a | 23 | [Chemical Formula8] 8 | 75 | ○ | 90 | ○ | ○ | ○ | ○ |
| Example 32 | Synthesis Example16 16-a | 23 | [Chemical Formula10] 8 | 76 | ○ | 92 | ○ | ○ | ○ | ○ |
| Example 33 | Synthesis Example17 17-a | 23 | [Chemical Formula12] 8 | 71 | ○ | 90 | ○ | ○ | ○ | ○ |
| Example 34 | Synthesis Example17 17-a | 23 | [Chemical Formula9] 8 | 72 | ○ | 89 | ○ | ○ | ○ | ○ |
| Example 35 | Synthesis Example18 18-a | 23 | [Chemical Formula11] 8 | 75 | ○ | 90 | ○ | ○ | ○ | ○ |
| Example 36 | Synthesis Example18 18-a | 23 | [Chemical Formula7] 8 | 78 | ○ | 92 | ○ | ○ | ○ | ○ |

TABLE 5

| | Siloxane copolymer (100 parts by weight) | Quinonediazide | UV absorber | Sensitivity (mJ) | Resolution | Transmittance | Light fastness | Crack | Whitening | OLED Reliability |
|---|---|---|---|---|---|---|---|---|---|---|
| Comparative Example 1 | Synthesis Example1 1-a | 23 | [Chemical Formula13] 8 | 75 | X | 93 | X | ○ | X | X |
| Comparative Example 2 | Synthesis Example1 1-a | 23 | [Chemical Formula14] 8 | 72 | X | 94 | X | ○ | X | X |
| Comparative Example 3 | Synthesis Example1 1-a | 23 | [Chemical Formula16] 8 | 70 | ○ | 93 | X | ○ | ○ | X |
| Comparative Example 4 | Synthesis Example1 1-a | 23 | [Chemical Formula17] 8 | 71 | ○ | 94 | X | ○ | ○ | X |
| Comparative Example 5 | Synthesis Example1 1-a | 23 | [Chemical Formula15] 8 | 72 | ○ | 94 | X | ○ | ○ | X |
| Comparative Example 6 | Synthesis Example5 5-a | 23 | [Chemical Formula13] 8 | 75 | X | 93 | X | ○ | X | X |
| Comparative Example 7 | Synthesis Example5 5-a | 23 | [Chemical Formula14] 8 | 79 | X | 94 | X | ○ | X | X |

TABLE 5-continued

| | Siloxane copolymer (100 parts by weight) | Quinonediazide | UV absorber | Sensitivity (mJ) | Resolution | Transmittance | Light fastness | Crack | Whitening | OLED Reliability |
|---|---|---|---|---|---|---|---|---|---|---|
| Comparative Example 8 | Synthesis Example5-a | 23 | [Chemical Formula16] 8 | 75 | ○ | 93 | X | ○ | ○ | X |
| Comparative Example 9 | Synthesis Example5 5-a | 23 | [Chemical Formula17] 8 | 76 | ○ | 91 | X | ○ | ○ | Δ |
| Comparative Example 10 | Synthesis Example5 5-a | 23 | [Chemical Formula15] 8 | 78 | ○ | 90 | X | ○ | ○ | Δ |
| Comparative Example 11 | Synthesis Example1 1-a | 23 | — | 68 | ○ | 95 | X | ○ | ○ | X |

Through Tables 3, 4, and 5, it was confirmed that the positive photosensitive resin compositions prepared in Examples 1 to 36 according to the invention, compared to Comparative Examples 1 to 11, generally have excellent performances such as sensitivity and resolution, and the like, and simultaneously, have excellent weatherability, i.e., light fastness, thus securing excellent panel reliability, by using a specific UV absorber of Chemical Formula 1 in combination with a siloxane copolymer and a quinonediazide compound, and thus can be usefully applied in an interlayer dielectric, a planarization layer or PDL, and the like in various OLED displays.

Conversely, for Comparative Examples 1 to 10 wherein benzotriazole-based or benzotriazine-based UV absorbers, different from the kind of the invention, are included, although some of sensitivity, transmittance, light fastness, cracks, and whitening may be decent, remaining properties were inferior, thus lowering OLED reliability. Further, for Comparative Example 11 wherein the UV absorber according to the invention was not used, light fastness and OLED reliability were lowered.

Experimental Example 2

Property Comparison According to the Kind of Siloxane Copolymer

The properties of Example 1, and Comparative Example 12 to 18 wherein the content of quinonediazide does not fall within the range of the invention, or a UV absorber of the invention is not used, or a different kind of UV absorber is mixed, were compared. The results are shown in Table 6.

TABLE 6

| | Siloxane copolymer (100 parts by weight) | quinone diazide | UV absorber | sensitivity (mJ) | resolution | transmittance | Light fastness | Crack | whitening | OLED Reliability |
|---|---|---|---|---|---|---|---|---|---|---|
| Example 1 | Synthesis Example1 1-a | 23 | [Chemical Formula4] 8 | 70 | ○ | 90 | ○ | ○ | ○ | ○ |
| Comparative Example 12 | Synthesis Example1 1-a | 54 | | 60 | X | 85 | X | ○ | X | X |
| Comparative Example 13 | Synthesis Example1 1-a | 3 | | 130 | X | 98 | X | X | ○ | X |
| Comparative Example 14 | Synthesis Example1 1-a | 54 | [Chemical Formula4] 4 [Chemical Formula13] 4 | 125 | X | 93 | ○ | ○ | X | X |
| Comparative Example 15 | Synthesis Example1 1-a | 54 | [Chemical Formula5] 4 [Chemical Formula14] 4 | 130 | X | 92 | ○ | ○ | X | X |
| Comparative Example 16 | Synthesis Example1 1-a | 54 | [Chemical Formula10] 9 [Chemical Formula15] 1 | 75 | ○ | 90 | ○ | ○ | ○ | X |
| Comparative Example 17 | Synthesis Example1 1-a | 54 | [Chemical Formula6] 9 [Chemical Formula17] 1 | 78 | ○ | 90 | ○ | ○ | ○ | X |
| Comparative Example 18 | Synthesis Example1 1-a | 54 | [Chemical Formula4] 9 [Chemical Formula16] 1 | 80 | ○ | 86 | ○ | ○ | ○ | X |

As shown in the Table 6, compared to Example 1 of the invention, in Comparative Examples 12 and 13, since the content of quinonediazide does not fall within the range of the invention, resolution was inferior, and particularly, since a UV absorber was not used, light fastness was inferior, and generally, panel reliability was inferior. Further, in Comparative Examples 14 to 18, although the absorber of the invention was used, since a bentriazole-based or benzotriazine-based UV absorber, which is different from the kind of the invention, was included, and the quinonediazide compound was relatively excessively used, even if some of sensitivity, transmittance, light fastness, cracks, and whitening may be decent, remaining properties are inferior, thus lowering OLED reliability.

Experimental Example 3

Property Comparison According to the Kind of Silexane Copolymer

The properties of Example 1, and Reference Examples 1 to 10 wherein different siloxane copolymers were used were compared, and the results are shown in Table 7.

As shown in Table 7, compared to Example 1, wherein different kinds of siloxane copolymers are included, even if a UV absorber identical to the invention is used, some properties among sensitivity, transmittance, light fastness, cracks, and whitening may be inadequate, and thus it can be seen that in case a siloxane copolymer of a specific structure is used, properties may be further improved.

Experimental Example 4

Property Comparison According to the Kind of Siloxane Copolymer

The properties of Example 1, and Reference Examples 11 to 18 wherein the contents of quinonediazide and/or UV absorber do not fall within the range of the invention, were compared, and the results are shown in Table 8.

TABLE 7

| | Siloxane copolymer (100 parts by weight) | Quinonediazide | UV absorber | sensitivity (mJ) | resolution | transmittance | light fastness | Crack | whitening | OLED reliability |
|---|---|---|---|---|---|---|---|---|---|---|
| Example 1 | Synthesis Example1 1-a | 23 | [Chemical Formula4] 8 | 70 | ○ | 90 | ○ | ○ | ○ | ○ |
| Reference Example 1 | Comparative Synthesis1 20-a | 23 | [Chemical Formula4] 8 | 95 | X | 84 | ○ | ○ | ○ | X |
| Reference Example 2 | Comparative Synthesis2 21-a | 23 | [Chemical Formula6] 8 | 92 | X | 83 | ○ | ○ | ○ | X |
| Reference Example 3 | Comparative Synthesis3 22-a | 23 | [Chemical Formula10] 8 | 89 | ○ | 84 | ○ | X | ○ | X |
| Reference Example 4 | Comparative Synthesis4 23-a | 23 | [Chemical Formula9] 8 | 91 | ○ | 85 | ○ | X | ○ | X |
| Reference Example 5 | Comparative Synthesis5 24-a | 23 | [Chemical Formula7] 8 | 90 | ○ | 86 | ○ | X | ○ | X |
| Reference Example 6 | Reference Synthesis1 1-b | 23 | [Chemical Formula11] 8 | 100 | X | 89 | ○ | ○ | ○ | X |
| Reference Example 7 | Reference Synthesis2 6-b | 23 | [Chemical Formula12] 8 | 110 | X | 89 | ○ | ○ | ○ | X |
| Reference Example 8 | Reference Synthesis3 8-b | 23 | [Chemical Formula8] 8 | 105 | X | 88 | ○ | ○ | ○ | X |
| Reference Example 9 | Reference Synthesis4 11-b | 23 | [Chemical Formula5] 8 | 100 | X | 90 | ○ | ○ | ○ | X |
| Reference Example 10 | Reference Synthesis5 12-b | 23 | [Chemical Formula4] 4 [Chemical Formula10] 4 | 95 | X | 88 | ○ | ○ | ○ | X |

TABLE 8

| | Siloxane copolymer (100 parts by weight) | Quinone diazide | UV absorber | sensitivity (mJ) | resolution | transmittance | light fastness | Crack | whitening | OLED reliability |
|---|---|---|---|---|---|---|---|---|---|---|
| Example 1 | Synthesis Example1 1-a | 23 | [Chemical Formula4] 8 | 70 | ○ | 90 | ○ | ○ | ○ | ○ |
| Reference Example 11 | Synthesis Example1 1-a | 54 | [Chemical Formula6] 8 | 70 | X | 85 | ○ | ○ | ○ | X |
| Reference Example 12 | Synthesis Example1 1-a | 54 | [Chemical Formula7] 12 | 75 | ○ | 82 | ○ | ○ | X | Δ |
| Reference Example 13 | Synthesis Example1 1-a | 23 | [Chemical Formula6] 12 | 200 | ○ | 88 | ○ | ○ | ○ | Δ |
| Reference Example 14 | Synthesis Example1 1-a | 3 | [Chemical Formula10] 8 | 160 | X | 98 | ○ | X | ○ | X |
| Reference Example 15 | Synthesis Example1 1-a | 3 | [Chemical Formula12] 12 | 200 | X | 96 | ○ | X | ○ | X |
| Reference Example 16 | Synthesis Example1 1-a | 23 | [Chemical Formula9] 12 | 120 | ○ | 92 | ○ | ○ | X | X |
| Reference Example 17 | Synthesis Example1 1-a | 23 | [Chemical Formula7] 12 | 130 | X | 85 | ○ | ○ | X | X |
| Reference Example 18 | Synthesis Example1 1-a | 3 | [Chemical Formula4] 6 | 185 | X | 95 | ○ | X | ○ | X |

As shown in Table 8, compared to Example 1, in Reference Examples 11 and 12, the content of quinonediazide compounds was too large, and thus resolution was inferior, and OLED reliability was lowered. Particularly, in Reference Example 12, due to an excessive UV absorber content, whitening occurred.

Further, in the case of Reference Examples 13 to 18, the content of the quinonediazide compound was too small or the content of UV absorber was excessive, and thus all of sensitivity, transmittance, light fastness, cracks, and whitening could not be satisfied.

Experimental Example 5

Property Comparison According to the Content Ratio of UV Absorber

In order to compare properties with respect to the content ratio of quinonediazide and a UV absorber, property evaluation was progressed using the composition described in the following table, and the results are shown in Table 9.

TABLE 9

| | Siloxane copolymer (100 parts by weight) | quinone diazide | UV absorber | sensitivity (mJ) | resolution | transmittance | light fastness | Crack | whitening | OLED reliability |
|---|---|---|---|---|---|---|---|---|---|---|
| 1 | Synthesis Example1 1-a | 23 | [Chemical Formula4] 8 | 70 | ○ | 90 | ○ | ○ | ○ | ○ |
| Reference Example 19 | Synthesis Example1 1-a | 23 | [Chemical Formula4] 16 | 75 | ○ | 89 | ○ | ○ | ○ | ○ |
| Reference Example 20 | Synthesis Example1 1-a | 23 | [Chemical Formula4] 24 | 95 | ○ | 88 | ○ | ○ | ○ | ○ |
| Reference Example21 | Synthesis Example1 1-a | 21 | [Chemical Formula4] 1 | 70 | ○ | 86 | Δ | ○ | ○ | Δ |

As shown in Table 9, with respect to the content ratio of the UV absorber and quinonediazide compound, sensitivity deteriorated to some degree, or light fastness tended to decrease.

What is claimed is:

1. A positive photosensitive resin composition comprising:
    100 parts by weight of a siloxane-based copolymer;
    5 to 50 parts by weight of a 1,2 quinonediazide compound;
    0.1 to 10 parts by weight of one or more kinds of UV absorbers represented by the following Chemical Formula 1; and
    a solvent included in such an amount that the solid content of the total resin composition becomes 10 to 90 wt %, wherein the siloxane-based copolymer contains an unreacted monomer content less than 10 wt % and a residual catalyst content less than 2,000 ppm:

[Chemical Formula 1]

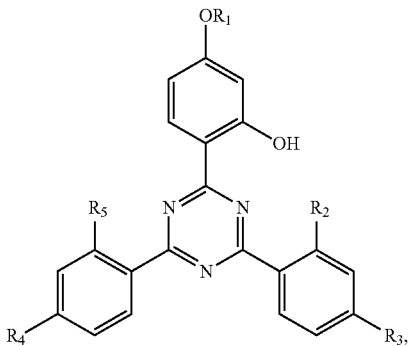

wherein $R_1$ is one or more functional groups selected from the group consisting of hydrogen, a substituted or unsubstituted C1-20 alkyl, a substituted or unsubstituted C3-20 cycloalkyl, a substituted or unsubstituted C2-10 alkenyl, a substituted or unsubstituted C6-18 aryl, a substituted or unsubstituted C7-18 alkylaryl, a substituted or unsubstituted C7-18 arylalkyl, a substituted or unsubstituted C1-20 alkoxy, a substituted or unsubstituted C1-30 acetal, a substituted or unsubstituted C1-30 hemiacetal, a substituted or unsubstituted C1-20 heteroalkyl, a substituted or unsubstituted C3-20 cycloheteroalkyl, a substituted or unsubstituted C2-10 heteroalkenyl, a substituted or unsubstituted C6-18 heteroaryl, a substituted or unsubstituted C7-18 heteroalkylaryl, a substituted or unsubstituted C7-18 heteroarylalkyl, a substituted or unsubstituted C1-20 heteroalkoxy, a substituted or unsubstituted C1-30 heteroacetal, and a substituted or unsubstituted C1-30 heterohemiacetal, and wherein $R_2$ to $R_5$ are each independently one or more functional groups selected from the group consisting of hydrogen, hydroxy, a substituted or unsubstituted C1-20 alkyl, a substituted or unsubstituted C3-20 cycloalkyl, a substituted or unsubstituted C2-10 alkenyl, a substituted or unsubstituted C6-18 aryl, a substituted or unsubstituted C7-18 alkylaryl, a substituted or unsubstituted C7-18 arylalkyl, a substituted or unsubstituted C1-20 alkoxy, a substituted or unsubstituted C1-30 acetal, a substituted or unsubstituted C1-30 hemiacetal, a substituted or unsubstituted C1-20 heteroalkyl, a substituted or unsubstituted C3-20 cycloheteroalkyl, a substituted or unsubstituted C2-10 heteroalkenyl, a substituted or unsubstituted C6-18 heteroaryl, a substituted or unsubstituted C7-18 heteroalkylaryl, a substituted or unsubstituted C7-18 heteroarylalkyl, a substituted or unsubstituted C1-20 heteroalkoxy, a substituted or unsubstituted C1-30 heteroacetal, and a substituted or unsubstituted C1-30 heterohemiacetal.

2. The positive photosensitive resin composition according to claim 1, wherein $R_1$ is a substituted or unsubstituted C1-20 alkyl group,
wherein $R_2$ to $R_4$ are each independently or simultaneously one or more functional groups selected from the group consisting of hydrogen and a substituted or unsubstituted C1-20 alkoxy group, and
wherein $R_5$ is a hydroxy group.

3. The positive photosensitive resin composition according to claim 1, wherein $R_1$ is one or more functional groups selected from the group consisting of a substituted or unsubstituted C1-20 alkyl, a substituted or unsubstituted C1-30 acetal, and a substituted or unsubstituted C1-30 hemiacetal, and
wherein $R_2$ to $R_5$ are each independently or simultaneously a substituted or unsubstituted C1-20 alkyl group.

4. The positive photosensitive resin composition according to claim 3, wherein $R_1$ includes an alkyl group, which is substituted with a hydroxy group or a C1-12 alkyl or alkoxy group, or interrupted by an oxygen atom, a carbonyl group, or an ester group.

5. The positive photosensitive resin composition according to claim 1, wherein $R_1$ is one or more functional groups selected from the group consisting of a substituted or unsubstituted C1-20 alkyl, a substituted or unsubstituted C1-30 acetal, and a substituted or unsubstituted C1-30 hemiacetal,
wherein $R_2$ and $R_3$ are each independently hydrogen, and
wherein $R_4$ and $R_5$ are each independently or simultaneously one or more functional groups selected from the group consisting of hydrogen, a substituted or unsubstituted C6-18 aryl, a substituted or unsubstituted C7-18 alkylaryl, and a substituted or unsubstituted C7-18 arylalkyl.

6. The positive photosensitive resin composition according to claim 5, wherein $R_1$ includes an alkyl group, which is substituted with a hydroxy group or a C1-12 alkyl or alkoxy group, or interrupted by an oxygen atom, a carbonyl group, or an ester group.

7. The positive photosensitive resin composition according to claim 1, wherein in Chemical Formula 1, $R_1$ is a substituted or unsubstituted C1-20 alkyl group, and
wherein $R_2$ to $R_5$ are each independently or simultaneously one or more functional groups selected from the group consisting of hydrogen and a substituted or unsubstituted C1-20 alkyl group.

8. The positive photosensitive resin composition according to claim 1, wherein the siloxane-based copolymer is obtained by hydrolysis and condensation polymerization of i) 10 to 90 parts by weight of a silane compound represented by the following Chemical Formula 2, and ii) 10 to 90 parts by weight of a silane compound represented by the following Chemical Formula 3, based on 100 parts by weight of total monomers:

$(R_6)_nSi(R_7)_{4-n}$, [Chemical Formula 2]

wherein $R_6$'s are identical to or different from one another, and are each independently hydrogen, a C1-10 alkyl, a C2-10 acyl, a C2-10 alkenyl, or a C6-20 aryl,
wherein $R_7$'s are identical to or different from one another, and are each independently, hydrogen, alkoxy, or chloro, and
wherein n is an integer of 1 to 3, $Si(OR_8)_4$, [Chemical Formula 3]

wherein $R_8$'s are identical to or different from one another, and are each independently methyl, ethyl, propyl, isopropyl, or butyl.

9. The positive photosensitive resin composition according to claim 1, wherein the siloxane copolymer has a polystyrene-converted weight average molecular weight of 1,000 g/mol to 30,000 g/mol.

10. The positive photosensitive resin composition according to claim 1, wherein the 1.2-quinonediazide compound is one or more selected from the group consisting of 1,2-quinonediazide 4-sulfonic acid ester, 1,2-quinonediazide 5-sulfonic acid ester, and 1,2-quinonediazide 6-sulfonic acid ester.

11. The positive photosensitive resin composition according to claim 1, wherein the UV absorber is one or more selected from compounds represented by the following Chemical Formulas 4 and 5, Chemical Formula 6-1, Chemical Formula 6-2, and Chemical Formulas 7 to 12:

[Chemical Formula 4]

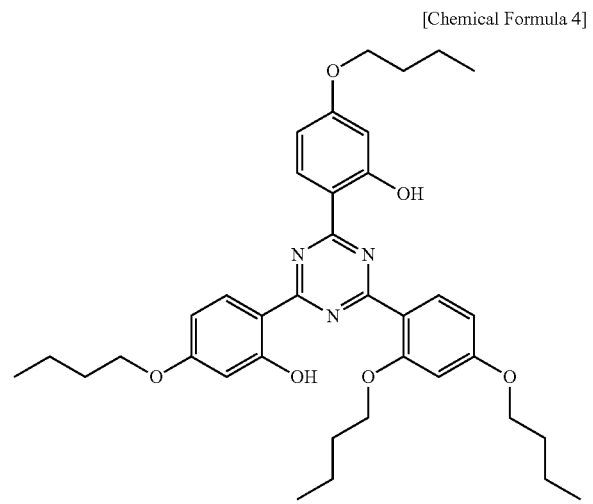

[Chemical Formula 5]

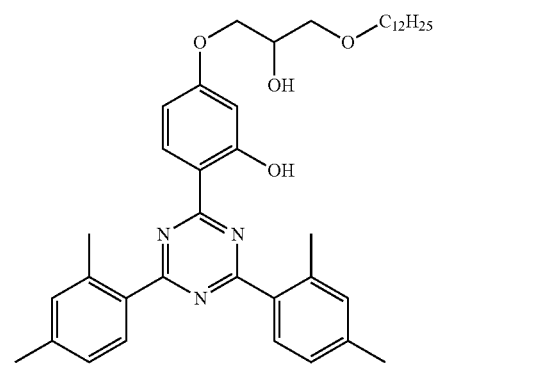

[Chemical Formula 6-1]

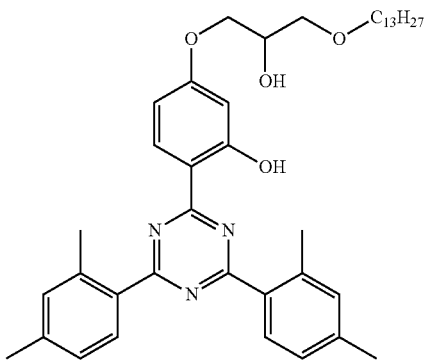

[Chemical Formula 6-2]

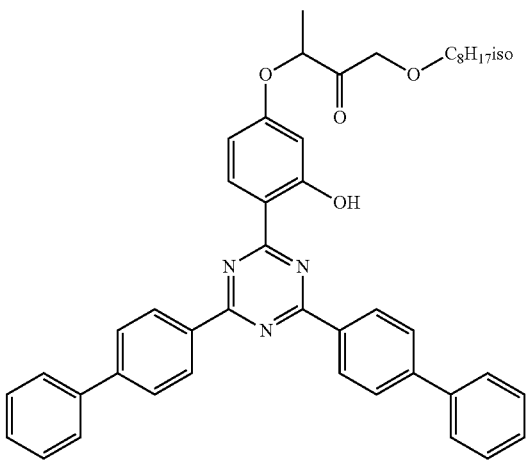

[Chemical Formula 7]

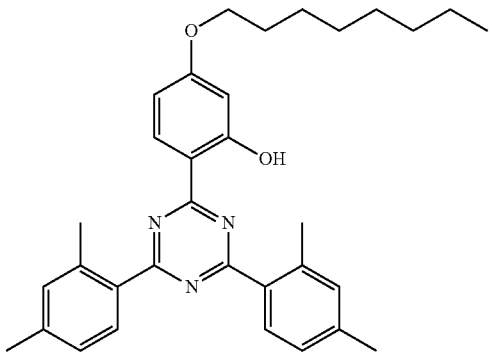

[Chemical Formula 8]

[Chemical Formula 9]

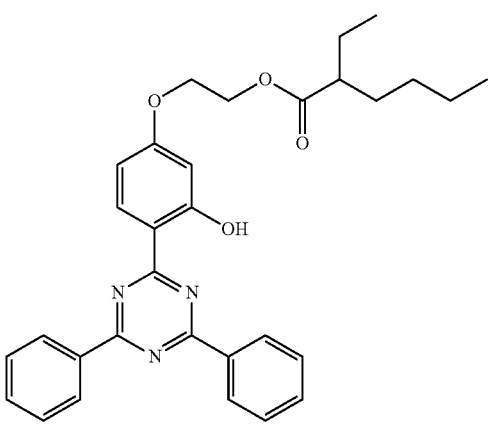

[Chemical Formula 10]

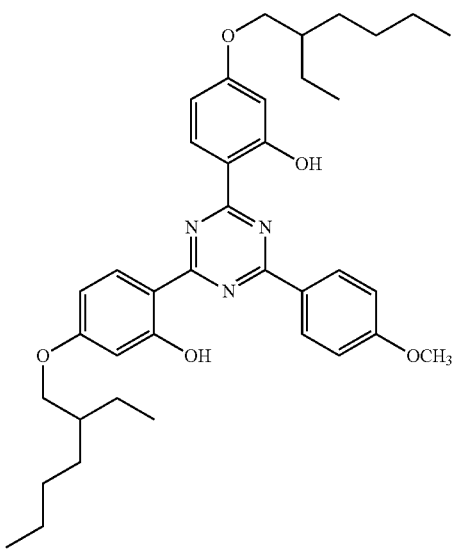

[Chemical Formula 11]

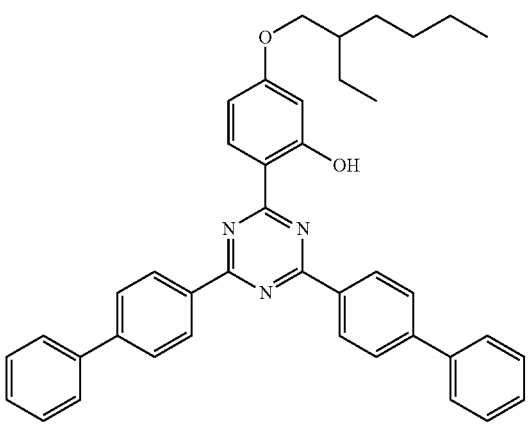

[Chemical Formula 12]

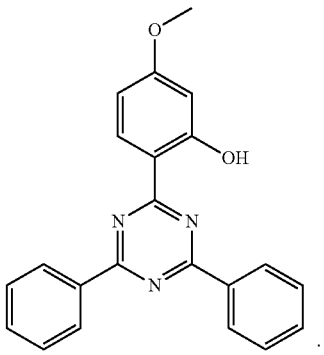

12. The positive photosensitive resin composition according to claim 11, wherein the UV absorber is a mixture of two kinds, including:
a mixture of i) one selected from the group consisting of Chemical Formula 4, Chemical Formula 5, a mixture of Chemical Formula 6-1 and Chemical Formula 6-2, and Chemical Formula 8; and ii) one selected from the group consisting of Chemical Formula 7, Chemical Formula 9, and Chemical Formula 10; or
a mixture of iii) one selected from the group consisting of Chemical Formula 9 and Chemical Formula 10; and iv) one selected from the group consisting of Chemical Formula 11 and Chemical Formula 12.

13. The positive photosensitive resin composition according to claim 1, wherein the solvent is one or more selected from the group consisting of methanol, ethanol, benzyl alcohol, hexyl alcohol, ethylene glycol methylether acetate, ethylene glycol ethyletheracetate, ethylene glycol methylether propionate, ethylene glycol ethylether propionate, ethylene glycol methylether, ethylene glycol ethylether, diethylene glycol monomethylether, diethylene glycol monoethylether, diethylene glycol dimethylether, diethylene glycol methyl ethylether, propylene glycol methylether acetate, propylene glycol ethylether acetate, propylene glycol propylether acetate, propylene glycol methylether propionate, propylene glycol ethylether propionate, propylene glycol propylether propionate, propylene glycol methylether, propylene glycol ethylether, propylene glycol propylether, propylene glycol butylether, dipropylene glycol dimethylether, dipropylene glycol diethylether, butylene glycol monomethyl ether, butylene glycol monoethylether, dibutylene glycol dimethylether, and dibutylene glycol diethylether.

14. The positive photosensitive resin composition according to claim 1, wherein the UV absorber and the 1,2-quinonediazide compound are included at the weight ratio of 1:1 to 1:20.

15. A cured film comprising a cured body of the positive photosensitive resin composition according to claim 1.

16. The cured film according to claim 15, wherein transmittance at the wavelength of 400 nm, based on the film thickness of 3 μm, is equal to or greater than 80% and less than 95%.

17. A display device comprising a cured body of the positive photosensitive resin composition according to claim 1.

* * * * *